US012684932B2

(12) United States Patent (10) Patent No.: US 12,684,932 B2
Adachi et al. (45) Date of Patent: Jul. 14, 2026

(54) ORGANIC LIGHT RECEIVING ELEMENT AND LIGHT RECEIVING DEVICE

(71) Applicants: KYUSHU UNIVERSITY, NATIONAL UNIVERSITY CORPORATION, Fukuoka (JP); HAMAMATSU PHOTONICS K.K., Hamamatsu (JP)

(72) Inventors: Chihaya Adachi, Fukuoka (JP); Hajime Nakanotani, Fukuoka (JP); Takahiko Yamanaka, Hamamatsu (JP); Shigeo Hara, Hamamatsu (JP)

(73) Assignees: KYUSHU UNIV., NATIONAL UNIV. CORPORATION, Fukuoka (JP); HAMAMATSU PHOTONICS K.K., Hamamatsu (JP)

( * ) Notice: Subject to any disclaimer, the term of this patent is extended or adjusted under 35 U.S.C. 154(b) by 404 days.

(21) Appl. No.: 18/269,627

(22) PCT Filed: Jan. 17, 2022

(86) PCT No.: PCT/JP2022/001425
§ 371 (c)(1),
(2) Date: Jun. 26, 2023

(87) PCT Pub. No.: WO2022/158425
PCT Pub. Date: Jul. 28, 2022

(65) Prior Publication Data
US 2024/0057354 A1 Feb. 15, 2024

(30) Foreign Application Priority Data
Jan. 22, 2021 (JP) ................................. 2021-008681

(51) Int. Cl.
*H10K 30/00* (2023.01)
*H10K 30/20* (2023.01)
(Continued)

(52) U.S. Cl.
CPC ............. *H10K 30/00* (2023.02); *H10K 30/20* (2023.02); *H10K 30/353* (2023.02); *H10K 50/00* (2023.02); *H10K 2101/30* (2023.02)

(58) Field of Classification Search
CPC ...... H10K 30/00; H10K 30/20; H10K 30/353; H10K 50/00; C09K 11/06; G02F 1/01
See application file for complete search history.

(56) References Cited

U.S. PATENT DOCUMENTS

2013/0264518 A1* 10/2013 Yersin ................ H10K 85/6576
252/301.16
2013/0277656 A1* 10/2013 Seo ...................... H10K 50/155
257/40
(Continued)

FOREIGN PATENT DOCUMENTS

JP H9-294229 A 11/1997
JP 2007-123707 A 5/2007
(Continued)

OTHER PUBLICATIONS

International Preliminary Report on Patentability mailed Aug. 3, 2023 for PCT/JP2022/001425.
(Continued)

*Primary Examiner* — Moazzam Hossain
(74) *Attorney, Agent, or Firm* — Faegre Drinker Biddle & Reath LLP

(57) ABSTRACT

An organic light-receiving element includes an organic light-receiving layer containing a plurality of organic semiconductor molecules. Each of the plurality of organic semiconductor molecules is a molecule in which an excited state enabling reverse intersystem crossing from a lowest excited triplet state to a lowest excited singlet state is formed in each of the plurality of organic semiconductor molecules due to irradiation with light.

12 Claims, 14 Drawing Sheets

(51) Int. Cl.
| | |
|---|---|
| *H10K 30/30* | (2023.01) |
| *H10K 50/00* | (2023.01) |
| *H10K 101/30* | (2023.01) |

(56) References Cited

U.S. PATENT DOCUMENTS

| | | | |
|---|---|---|---|
| 2018/0149595 A1 | 5/2018 | Adachi et al. | |
| 2018/0190924 A1 | 7/2018 | Tsang et al. | |
| 2019/0131531 A1* | 5/2019 | Luschtinetz | .......... C07F 9/5325 |
| 2020/0317704 A1* | 10/2020 | Galan | .................. C07D 221/18 |
| 2020/0371269 A1 | 11/2020 | Margaritova et al. | |
| 2024/0057354 A1 | 2/2024 | Adachi et al. | |

FOREIGN PATENT DOCUMENTS

| | | | |
|---|---|---|---|
| JP | 2013-533626 A | 8/2013 |
| JP | 2017206666 A | 11/2017 |
| JP | 2018124471 A | 8/2018 |
| JP | 2019-535136 A | 12/2019 |
| JP | 2020098789 A | 6/2020 |
| JP | 6735215 B2 | 8/2020 |
| WO | 2012/001002 A2 | 1/2012 |
| WO | WO-2013/054818 A1 | 4/2013 |
| WO | WO-2014/156771 A1 | 10/2014 |
| WO | WO-2018/055379 A1 | 3/2018 |
| WO | WO-2018/207776 A1 | 11/2018 |
| WO | 2020229909 A1 | 11/2020 |

OTHER PUBLICATIONS

Shipan Wang et al., "Highly Efficient Near-Infrared Delayed Fluorescence Organic Light Emitting Diodes Using a Phenanthrene-Based Charge-Transfer Compound", Wiley-VCH Verlag Gmbh & Co. KGaA, Weinheim, 2015, p. 13068-p. 13072.

Takahiko Yamanaka et al., "Near-infrared organic light-emitting diodes for biosensing with high operating stability", The Japan Society of Applied Physics, 2017, p. 074101.

Takahiko Yamanaka et al., "Slow recombination of spontaneously dissociated organic fluorophore excitons", Nature Communications, 2019, p. 1-p. 6.

Office Action issued May 8, 2025 in related U.S. Appl. No. 17/578,629.

Takahiko Yamanaka et al, "Slow recombination of spontaneously dissociated organic fluorophoreexcttons", 2019, p. 1-p. 7.

Office Action issued Aug. 14, 2025 in related U.S. Appl. No. 17/578,629.

Xu Wang et al, "High performance organic ultraviolet photodetector with efficient electroluminescence realized by a thermally activated del ayed fluorescence emitter", Applied Physics Letters vol. 107 DOI:10.1063/1.4927652, 2015, p. 043303-1-p. 043303-5.

Mengge Wu et al, "High-performance organic light-emitting photodete ctor fabricated by separating photodetective center from emissive layer without luminance trade-off", Optics Letters vol. 43,No. 18 DOI:10.1364/OL.43.004502, 2018, p. 4502-p. 4505.

* cited by examiner (a)

(b)

(c)

(a)

(b)

(a)

(b)

(c)

(d)

(a)

(b)

(c)

(a)

(b)

ORGANIC LIGHT RECEIVING ELEMENT AND LIGHT RECEIVING DEVICE

TECHNICAL FIELD

The present disclosure relates to an organic light-receiving element and a light-receiving device.

BACKGROUND ART

A bulk heterojunction is typically employed in a photoelectric conversion layer composed of an organic semiconductor material (for example, refer to Patent Literature 1 and Patent Literature 2). However, in the photoelectric conversion layer, excited molecules diffused to the vicinity of an interface of the bulk heterojunction escape from Coulomb binding due to an energy difference between donor molecules and acceptor molecules, and charge separation may occur.

CITATION LIST

Patent Literature

Patent Literature 1: Japanese Unexamined Patent Publication No. 2007-123707
Patent Literature 2: Japanese Patent No. 6735215

SUMMARY OF INVENTION

Technical Problem

However, in the above-described photoelectric conversion layer, since it is necessary to ensure a large energy difference between the donor molecules and the acceptor molecules, an open circuit voltage decreases, and as a result, there is a concern that charge separation becomes insufficient. In addition, an area of the interface of the bulk heterojunction decreases depending on how to mix the donor molecules and the acceptor molecules, and as a result, there is a concern that charge separation may be insufficient.

An object of the present disclosure is to provide an organic light-receiving element capable of obtaining sufficient charge separation, and a light-receiving device including the organic light-receiving element.

Solution to Problem

According to an aspect of the present disclosure, there is provided an organic light-receiving element including an organic light-receiving layer containing a plurality of organic semiconductor molecules. Each of the plurality of organic semiconductor molecules is a molecule in which an excited state enabling reverse intersystem crossing from a lowest excited triplet state to a lowest excited singlet state is formed in each of the plurality of organic semiconductor molecules due to irradiation with light.

In the organic light-receiving element, an excited state enabling reverse intersystem crossing from a lowest excited triplet state to a lowest excited singlet state is formed in each of the plurality of organic semiconductor molecules due to irradiation with light. That is, an excited state enabling reverse intersystem crossing from the lowest excited triplet state to the lowest excited singlet state occurs in each of the plurality of organic semiconductor molecules due to irradiation with light. According to this, with respect to each of the plurality of organic semiconductor molecules, in addition to direct charge separation from the lowest excited singlet state, charge separation from the lowest excited triplet state having a longer lifetime in comparison to the lowest excited singlet state (hereinafter, referred to as "direct charge separation from lowest excited triplet state"), and/or charge separation from the lowest excited singlet state in which the lowest excited triplet state having a longer lifetime in comparison to the lowest excited singlet state is set as a temporary shelter from deactivation (hereinafter, referred to as "charge separation from the lowest excited singlet state through the lowest excited triplet state") become possible. Accordingly, according to the organic light-receiving element, sufficient charge separation can be obtained.

In the organic light-receiving element according to the aspect of the present disclosure, in each of the plurality of organic semiconductor molecules, a difference between energy of the lowest excited singlet state and energy of the lowest excited triplet state at an absolute temperature of 77 K may be less than 0.3 eV. According to this, the organic semiconductor molecules can be caused to function as molecules in which an excited state enabling the reverse intersystem crossing from the lowest excited triplet state to the lowest excited singlet state occurs due to irradiation with light.

In the organic light-receiving element according to the aspect of the present disclosure, in each of the plurality of organic semiconductor molecules, an intersystem crossing rate constant from the lowest excited singlet state to the lowest excited triplet state may be greater than a radiative decay rate constant from the lowest excited singlet state to the ground state. According to this, direct charge separation from the lowest excited triplet state and/or charge separation from the lowest excited singlet state through the lowest excited triplet state become possible while suppressing deactivation from the lowest excited singlet state due to light-emission.

In the organic light-receiving element according to the aspect of the present disclosure, in each of the plurality of organic semiconductor molecules, the intersystem crossing rate constant from the lowest excited singlet state to the lowest excited triplet state may be greater than a reverse intersystem crossing rate constant from the lowest excited triplet state to the lowest excited singlet state. According to this, the lifetime of the lowest excited triplet state is lengthened, and thus photoelectric conversion efficiency can be improved.

In the organic light-receiving element according to the aspect of the present disclosure, in each of the plurality of organic semiconductor molecules, the intersystem crossing rate constant from the lowest excited singlet state to the lowest excited triplet state may be two or more times the reverse intersystem crossing rate constant from the lowest excited triplet state to the lowest excited singlet state. According to this, the lifetime of the lowest excited triplet state is lengthened, and thus photoelectric conversion efficiency can be improved.

In the organic light-receiving element according to the aspect of the present disclosure, in each of the plurality of organic semiconductor molecules, the reverse intersystem crossing rate constant from the lowest excited triplet state to the lowest excited singlet state may be $1 \times 10^7$ (sec$^{-1}$) or less. According to this, the lifetime of the lowest excited triplet state is lengthened, and thus photoelectric conversion efficiency can be improved.

In the organic light-receiving element according to the aspect of the present disclosure, a dipole moment of each of the plurality of organic semiconductor molecules may be greater than 0 D. According to this, energy necessary for charge separation can be reduced.

In the organic light-receiving element according to the aspect of the present disclosure, the organic light-receiving layer further may contain a plurality of host molecules, and energy of the lowest excited triplet state at an absolute temperature of 77 K in each of the plurality of host molecules may be higher than energy of the lowest excited triplet state at an absolute temperature of 77 K in each of the plurality of organic semiconductor molecules. According to this, it is possible to suppress a decrease in photoelectric conversion efficiency due to an influence of the plurality of host molecules.

The organic light-receiving element according to the aspect of the present disclosure may further include a first electrode disposed on one side of the organic light-receiving layer, and a second electrode disposed on the other side of the organic light-receiving layer. According to this, it is possible to detect a current that is generated due to charge separation.

In the organic light-receiving element according to the aspect of the present disclosure, at least one of the first electrode and the second electrode may have a light-transmitting property with respect to light emitted to the organic light-receiving layer. According to this, it is possible to reliably cause light to be incident to the organic light-receiving layer.

The organic light-receiving element according to the aspect of the present disclosure may further include a charge block layer disposed at any one of a first position between the organic light-receiving layer and the first electrode, and a second position between the organic light-receiving layer and the second electrode. In a case where the charge block layer is disposed at the first position between the organic light-receiving layer and the first electrode, for example, in a state in which a voltage is applied between the first electrode and the second electrode so that an electric field in a direction of causing charge separation occurs in the organic light-receiving layer, when charge separation occurs in the organic light-receiving layer due to incidence of light, one of an electron and a hole generated due to the charge separation is suppressed from moving to the first electrode by the charge block layer, and stays in the organic light-receiving layer, and the other of the electron and the hole generated due to the charge separation moves to the second electrode. After a certain amount of time has passed in this state, for example, when a voltage is applied between the first electrode and the second electrode so that an electric field in a direction opposite to the direction of causing the charge separation occurs in the organic light-receiving layer, the other of the electron and the hole moves from the second electrode to the organic light-receiving layer, and is coupled to the one of the electron and the hole staying in the organic light-receiving layer. In addition, in a case where the charge block layer is disposed at the second position between the organic light-receiving layer and the second electrode, for example, in a state in which a voltage is applied between the first electrode and the second electrode so that an electric field in a direction of causing charge separation occurs in the organic light-receiving layer, when charge separation occurs in the organic light-receiving layer due to incidence of light, one of an electron and a hole generated due to the charge separation is suppressed from moving to the second electrode by the charge block layer, and stays in the organic light-receiving layer, and the other of the electron and the hole generated due to the charge separation moves to the first electrode. After a certain amount of time has passed in this state, for example, when a voltage is applied between the first electrode and the second electrode so that an electric field in a direction opposite to the direction of causing the charge separation occurs in the organic light-receiving layer, the other of the electron and the hole moves to the organic light-receiving layer from the first electrode, and is coupled to the one of the electron and the hole staying in the organic light-receiving layer. In any case, when the other of the electron and hole moved to the organic light-receiving layer is coupled to the one of the electron and the hole staying in the organic light-receiving layer, a current is generated, and thus the organic light-receiving element can be caused to function as an optical memory element by detecting the current.

The organic light-receiving element according to the aspect of the present disclosure may further include a charge transport layer disposed at the other of the first position and the second position. According to this, it is possible to efficiently move the other of the electron and the hole from the organic light-receiving layer to the first electrode or the second electrode. In addition, it is possible to efficiently move the other of the electron and the hole from the first electrode or the second electrode to the organic light-receiving layer.

According to another aspect of the present disclosure, there is provided a light-receiving device including the organic light-receiving element and a controller electrically connected to the organic light-receiving element. The controller adjusts a potential difference between the first electrode and the second electrode in a light-receiving period so that an electric field in a direction of causing charge separation occurs in the organic light-receiving layer, and detects a current.

According to the light-receiving device, charge separation with more efficiency becomes possible in the organic light-receiving layer, and thus it is possible to detect a current with more efficiency in a light-receiving period.

According to still another aspect of the present disclosure, there is provided a light-receiving device including the organic light-receiving element and a controller electrically connected to the organic light-receiving element. The controller adjusts a potential difference between the first electrode and the second electrode in a light-receiving period so that an electric field in a direction of causing charge separation occurs in the organic light-receiving layer, and applies a voltage between the first electrode and the second electrode in an application period after passage of a holding period from the light-receiving period so that an electric field in a direction opposite to the direction of causing the charge separation occurs in the organic light-receiving layer, and detects a current.

According to the light-receiving device, charge separation with more efficiency becomes possible in the organic light-receiving layer, and thus it is possible to detect a current with more efficiency after passage of a holding period from the light-receiving period.

Advantageous Effects of Invention

According to the present disclosure, it is possible to provide an organic light-receiving element capable of obtaining sufficient charge separation, and a light-receiving device including the organic light-receiving element.

DESCRIPTION OF EMBODIMENTS

Figure 1:
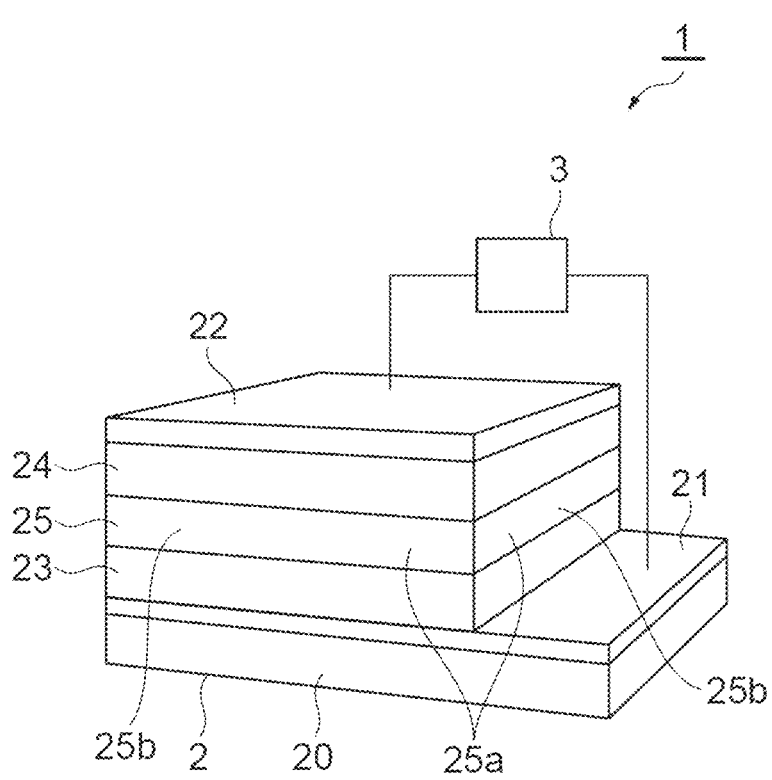
FIG. 1 is a configuration diagram of a light-receiving device of a first embodiment.

Embodiments of the present disclosure will be described in detail with reference to the accompanying drawings. Note that, in the respective drawings, the same reference numeral will be given to the same or equivalent portion, and redundant description will be omitted.

First Embodiment

FIG. 1 is a configuration diagram of a light-receiving device 1 of a first embodiment. As illustrated in FIG. 1, the light-receiving device 1 includes an organic light-receiving element 2. The organic light-receiving element 2 includes a support substrate 20, a first electrode 21, a second electrode 22, a first buffer layer 23, a second buffer layer 24, and an organic light-receiving layer 25. In the organic light-receiving element 2, the first electrode 21, the first buffer layer 23, the organic light-receiving layer 25, the second buffer layer 24, and the second electrode 22 are stacked on the support substrate 20 in this order from the support substrate 20 side. That is, in the organic light-receiving element 2, the first electrode 21 is disposed on one side (on the support substrate 20 side) of the organic light-receiving layer 25, and the second electrode 22 is disposed on the other side (side opposite to the support substrate 20) of the organic light-receiving layer 25.

The support substrate 20 has a light-transmitting property with respect to light (that is, light of a light-receiving target) that is emitted to the organic light-receiving layer 25. Examples of the support substrate 20 include a glass substrate, a thin glass film having flexibility, a resin film, and the like. As the glass substrate, for example, a quartz glass substrate, a synthetic quartz glass substrate, Pyrex (registered trademark) glass substrate, or the like can be used. As the resin film, for example, a PET film, a PEN film, a polyimide film, or the like can be used. In a case where the support substrate 20 is the resin film, it is preferable that the resin film has a water vapor barrier property, and it is more preferable that the resin film has a water vapor permeability of $10^{-3}$ (g/m²·day) or lower from the viewpoint of a long lifetime. As the resin film (a water vapor barrier film) having the water vapor barrier property, for example, a film in which a $SiO_2$ film or a SiN film is formed on a surface, or the like can be employed.

The first electrode 21 has a light-transmitting property with respect to light emitted to the organic light-receiving layer 25. As a material of the first electrode 21, for example, indium tin oxide, indium oxide, tin oxide, zinc oxide, or the like can be used. It is not necessary for the second electrode 22 to have the light-transmitting property with respect to light emitted to the organic light-receiving layer 25. As a material of the second electrode 22, aluminum, vanadium, gold, silver, platinum, iron, cobalt, carbon, nickel, tungsten, palladium, magnesium, calcium, tin, lead, titanium, yttrium, lithium, ruthenium, manganese, alloys containing these metals, and the like can be used.

Note that, as a buffer layer, a layer that adjusts a work function of an electrode or a charge injection barrier may be introduced onto a surface of at least one of the first electrode 21 and the second electrode 22. The first buffer layer 23 has a light-transmitting property with respect to light emitted to the organic light-receiving layer 25. As an example, in a case of using the first electrode 21 as a positive electrode, as a material of the first buffer layer 23, for example, metal oxides such as molybdenum oxide, tungsten oxide, nickel oxide, and vanadium oxide, a conductive polymer represented by PEDOT:PSS, and the like can be used. It is not necessary for the second buffer layer 24 to have the light-transmitting property with respect to light emitted to the organic light-receiving layer 25. As an example, in a case of using the second electrode 22 as a negative electrode, as a material of the second buffer layer 24, for example, metals such as magnesium, silver, calcium, titanium, zinc, cesium, and lithium, alloys containing these metals, metal oxides such as titanium oxide and zinc oxide, alkali metal compounds such as lithium fluoride, sodium fluoride, potassium fluoride, and cesium fluoride, alkali-earth metal compounds such as magnesium fluoride and calcium fluoride, and the like can be used. Note that, in a case where the first electrode 21 has the light-transmitting property with respect to light emitted to the organic light-receiving layer 25, at least the first buffer layer 23 may have the light-transmitting property with respect to light emitted to the organic light-receiving layer 25. In addition, in a case where the second electrode 22 has the light-emitting property with respect to light emitted to the organic light-receiving layer 25, at least the second buffer layer 24 may have the light-transmitting property with respect to light emitted to the organic light-receiving layer 25. In this case, for example, a film thickness of the second buffer layer 24 is preferably 50 nm or less.

The organic light-receiving layer 25 contains a plurality of organic semiconductor molecules 25a and a plurality of host molecules 25b. The plurality of organic semiconductor molecules 25a are constituted by the same kind of organic semiconductor molecules, and the plurality of host molecules 25b are constituted by the same kind of host molecules. That is, the organic light-receiving layer 25 contains one kind of organic semiconductor molecules 25a and one kind of host molecules 25b. In the organic light-receiving layer 25, charge separation occurs due to irradiation with light transmitted through the support substrate 20, the first electrode 21, and the first buffer layer 23 (details thereof will be described later).

As an example, the organic light-receiving element 2 configured as described above is manufactured as follows. First, the first electrode 21 composed of indium tin oxide is formed on a main surface on one side of the support substrate 20 that is a glass substrate. For example, the thickness of the first electrode 21 is approximately 100 nm. Next, the first buffer layer 23 is formed on the first electrode 21 by vacuum evaporation of molybdenum oxide. For example, the thickness of the first buffer layer 23 is approximately 30 nm. Next, the organic light-receiving layer 25 is formed on the first buffer layer 23 by vacuum evaporation of TPA-DCPP (the plurality of organic semiconductor molecules 25a) and CBP (the plurality of host molecules 25b) from evaporation sources different from each other. For example, the thickness of the organic light-receiving layer 25 is approximately 100 nm. For example, a mass ratio between the CBP and TPA-DCPP in the organic light-receiving layer 25 is 50:50. Next, the second buffer layer 24 is formed on the organic light-receiving layer 25 by vacuum evaporation of titanium oxide. For example, the thickness of the second buffer layer 24 is approximately 10 nm. Finally, the second electrode 22 composed of aluminum is formed on the second buffer layer 24. For example, the thickness of the second electrode 22 is approximately 100 nm.

Note that, the first buffer layer 23 having the light-transmitting property with respect to light emitted to the organic light-receiving layer 25 may not be disposed between the first electrode 21 and the organic light-receiving layer 25. The second buffer layer 24 may not be disposed between the second electrode 22 and the organic light-receiving layer 25. In a case where the first electrode 21 is caused to function as a positive electrode and the second electrode 22 is caused to function as a negative electrode, a hole transport layer or an electron block layer may be disposed between the first electrode 21 and the organic light-receiving layer 25. In a case where the first electrode 21 is caused to function as a positive electrode and the second electrode 22 is caused to function as a negative electrode, an electron transport layer or a hole block layer may be disposed between the second electrode 22 and the organic light-receiving layer 25. In a case where the first electrode 21 is caused to function as a negative electrode and the second electrode 22 is caused to function as a positive electrode, an electron transport layer or a hole block layer may be disposed between the first electrode 21 and the organic light-receiving layer 25. In a case where the first electrode 21 is caused to function as a negative electrode and the second electrode 22 is caused to function as a positive electrode, a hole transport layer or an electron block layer may be disposed between the second electrode 22 and the organic light-receiving layer 25. In a case where the first electrode 21 is caused to function as a negative electrode and the second electrode 22 is caused to function as a positive electrode, a material that is used for the first buffer layer 23 and a material that is used for the second buffer layer 24 may be substituted with each other.

As a material of the hole transport layer or the electron block layer, for example, metal oxides, porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazoles derivatives, isoindole derivatives, acene-based derivatives, fluorene derivatives, fluorenone derivatives, polyvinylcarbazoles, polymer materials with aromatic amine introduced into a main chain or a side chain, oligomers, polysilanes, conductive polymers, and the like can be used. As a material of the electron transport layer or the hole block layer, for example, nitrogen-containing aromatic heterocyclic derivatives, dibenzofuran derivatives, dibenzothiophene derivatives, silole derivatives, aromatic hydrocarbon ring derivatives, and the like can be used.

In the organic light-receiving element 2, layers (the second electrode 22, the second buffer layer 24, and the like) disposed on the second electrode 22 side with respect to the organic light-receiving layer 25 may have the light-transmitting property with respect to light emitted to the organic light-receiving layer 25. That is, the organic light-receiving element 2 may be configured so that charge separation in the organic light-receiving layer 25 occurs by irradiation with light transmitted through the layers disposed on the second electrode 22 side with respect to the organic light-receiving layer 25. In this case, it is not necessary for layers (the support substrate 20, the first electrode 21, the first buffer layer 23, and the like) disposed on the first electrode 21 side with respect to the organic light-receiving layer 25 to have the light-transmitting property with respect to light emitted to the organic light-receiving layer 25. In a case where light is incident to the organic light-receiving layer 25 from the second electrode 22 side, as the second electrode 22, for example, metal oxides such as indium tin oxide, indium oxide, tin oxide, and zinc oxide, metals such as aluminum, vanadium, gold, silver, platinum, iron, cobalt, carbon, nickel, tungsten, palladium, magnesium, calcium, tin, lead, titanium, yttrium, lithium, ruthenium, manganese, and alloys containing these metals may be formed to have, for example, a transmittance of 10% or more, a seat resistance of several hundreds of $\Omega$/sq or less, and a film thickness of 5 to 1000 nm (preferably, 5 to 100 nm). In a case where light is incident to the organic light-receiving layer 25 from the second electrode 22 side, as a material of the support substrate 20, for example, a silicon substrate, a sapphire substrate, or the like can be used. As described above, in the organic light-receiving element 2, at least one of the first electrode 21 and the second electrode 22 may have the light-transmitting property with respect to light emitted to the organic light-receiving layer 25.

The light-receiving device 1 further includes a controller 3. The controller 3 is electrically connected to the organic light-receiving element 2. The controller 3 applies a voltage between the first electrode 21 and the second electrode 22 in a light-receiving period so that an electric field in a direction of causing charge separation occurs in the organic light-receiving layer 25, and detects a current. The light-receiving period is a period for which the organic light-receiving layer 25 is irradiated with light of a light-receiving target, and is, for example, a period of 0.1 ns to 10 s. As an example, in a case where the first electrode 21 is caused to function as a positive electrode and the second electrode 22 is caused to function as a negative electrode, the controller 3 may apply a voltage between the first electrode 21 and the second electrode 22 so that a potential of the first electrode 21 becomes negative with a potential of the second electrode 22 set as a reference, or may apply a voltage between the first electrode 21 and the second electrode 22 so that the potential of the second electrode 22 becomes positive with the potential of the first electrode 21 set as a reference. In addition, in a case where the first electrode 21 is caused to function as a negative electrode and the second electrode 22 is caused to function as a positive electrode, the controller 3 may apply a voltage between the first electrode 21 and the second electrode 22 so that the potential of the first electrode 21 becomes positive with the potential of the second electrode 22 set as a reference, or may apply a voltage between the first electrode 21 and the second electrode 22 so that the potential of the second electrode 22 becomes negative with the potential of the first electrode 21 set as a reference. For example, the controller 3 is constituted by a voltage application circuit, a current read-out circuit, or the like.

Figure 2:
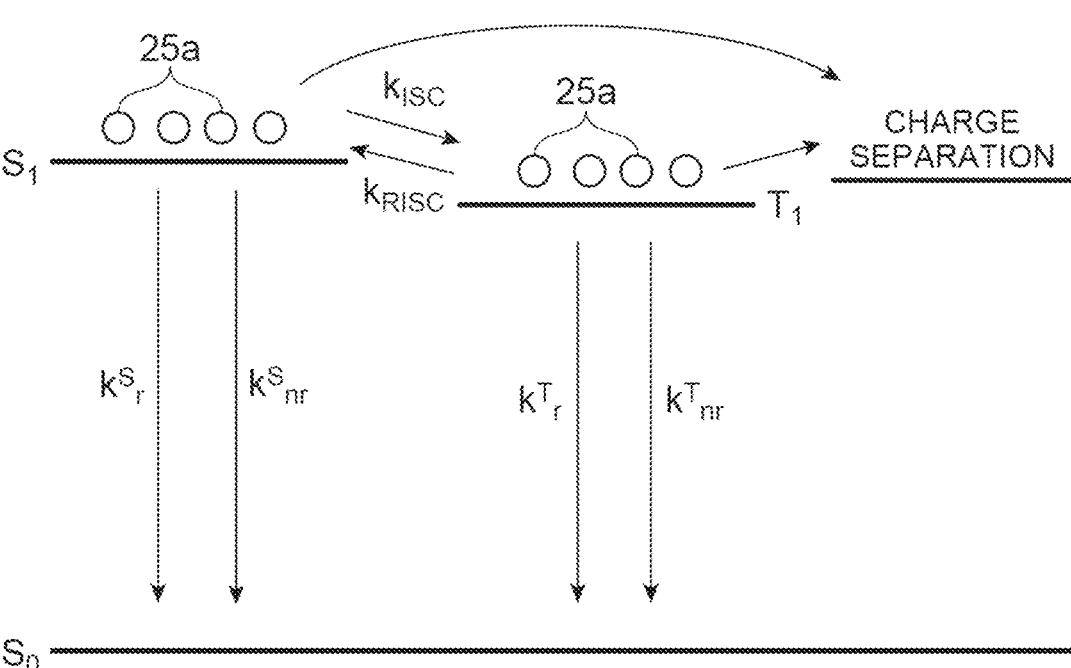
FIG. 2 is an energy diagram of an organic light-receiving layer illustrated in FIG. 1.

FIG. 2 is an energy diagram of the organic light-receiving layer 25 illustrated in FIG. 1. More specifically, FIG. 2 is an energy diagram of the organic light-receiving layer 25 in which an excited state is formed due to irradiation with light. In FIG. 2, $S_0$ represents a ground state, $S_1$ represents a lowest excited singlet state, $T_1$ represents a lowest excited triplet state. $k^S_r$ represents a radiative decay rate constant from the lowest excited singlet state $S_1$ to the ground state $S_0$, $k^S_{nr}$ represents a nonradiative decay rate constant from the lowest excited singlet state $S_1$ to the ground state $S_0$. $k^T_r$ represents a radiative decay rate constant from the lowest excited triplet state $T_1$ to the ground state $S_0$, $k^T_{nr}$ represents a nonradiative decay rate constant from the lowest excited triplet state $T_1$ to the ground state $S_0$. $k_{ISC}$ represents an intersystem crossing rate constant from the lowest excited singlet state $S_1$ to the lowest excited triplet state $T_1$, and $k_{RISC}$ represents a reverse intersystem crossing rate constant from the lowest excited triplet state $T_1$ to the lowest excited singlet state $S_1$.

As illustrated in FIG. 2, each of the plurality of organic semiconductor molecules 25a is a molecule in which an excited state enabling reverse intersystem crossing from the lowest excited triplet state $T_1$ to the lowest excited singlet state $S_1$ in each of the plurality of organic semiconductor molecules 25a is formed due to irradiation with light. In this case, intersystem crossing from the lowest excited singlet state $S_1$ to the lowest excited triplet state $T_1$ is possible in each of the plurality of organic semiconductor molecules 25a. Each of the plurality of organic semiconductor molecules 25a preferably includes a donor functional group, and an acceptor functional group.

Note that, the reverse intersystem crossing from "lowest excited triplet state $T_1$ to lowest excited singlet state $S_1$" includes not only "reverse intersystem crossing in which an excited molecule transitions from the lowest excited triplet state $T_1$ to the lowest excited singlet state $S_1$ without through another energy level", but also "reverse intersystem crossing in which an excited molecule transitions from the lowest excited triplet state $T_1$ to the lowest excited singlet state $S_1$ through another energy level (for example, a high-order energy level or the like)". Similarly, "intersystem crossing from the lowest excited singlet state $S_1$ to the lowest excited triplet state $T_1$" includes not only "intersystem crossing in which an excited molecule transitions from the lowest excited singlet state $S_1$ to the lowest excited triplet state $T_1$ without through another energy level", but also "intersystem crossing in which an excited molecule transitions from the lowest excited singlet state $S_1$ to the lowest excited triplet state $T_1$ through another energy level (for example, a high-order energy level or the like)".

In each of the plurality of organic semiconductor molecules 25a, a difference between energy of the lowest excited singlet state $S_1$ and energy of the lowest excited triplet state $T_1$ at an absolute temperature of 77 K is less than 0.3 eV. Note that, although not illustrated in FIG. 2, energy of a lowest excited triplet state at an absolute temperature of 77 K in each of the plurality of host molecules 25b is higher than energy of a lowest excited triplet state $T_1$ at an absolute temperature of 77 K in each of the plurality of organic semiconductor molecules 25a.

An energy level $E_{S1}$ that is energy of the lowest excited singlet state $S_1$ is obtained as follows. First, a film composed of the plurality of organic semiconductor molecules 25a is formed on an Si wafer. In the case of performing film formation by an evaporation method, a film thickness is preferably 50 nm to 100 nm. In the case of performing film formation by a spin coating method, a film thickness may be approximately 30 nm. Next, a fluorescence spectrum of the film composed of the plurality of organic semiconductor molecules 25a is measured at normal temperature (absolute temperature of 300 K). In measurement of the fluorescence spectrum, an LED, a tungsten lamp, or a deuterium lamp is used as an excitation light source, and a multi-channel spectroscope (C10027, manufactured by HAMAMATSU PHOTONICS K.K.) is used as a detector. Next, a tangent line is drawn with respect to short-wavelength side rising of a light-emission spectrum in which the vertical axis represents optical intensity and the horizontal axis represents a wavelength, a wavelength value $\lambda_{edge}$ (nm) of an intersection between the tangent line and the horizontal axis is obtained, and the energy level $E_{S1}$ is obtained from the following Expression (1).

$$E_{S1}(\text{eV}) = 1239.85/\lambda_{edge} \qquad (1)$$

Note that, the tangent line drawn with respect to the short-wavelength side rising of the fluorescence spectrum is a tangent line in which an inclination becomes a maximum value among tangent lines drawn at respective points of the fluorescence spectrum in a range from the short wavelength side of the fluorescence spectrum to a maximum value of the fluorescence spectrum appearing on the shortest wavelength side. A maximum value having peak intensity that is 10% or less of maximum peak intensity of the fluorescence spectrum does not become "the maximum value of the fluorescence spectrum appearing on the shortest wavelength side".

An energy level $E_{T1}$ that is energy of the lowest excited triplet state $T_1$ at an absolute temperature of 77 K is obtained as follows. First, an $S_1$ wafer (described above) on which the film composed of the plurality of organic semiconductor molecules 25a is formed is cooled down to the absolute temperature of 77 K by a cryostat (Optistat DN manufactured by Oxford Instruments). Next, in measurement of a phosphorescence spectrum, the same excitation light source and detector as in the measurement of the fluorescence spectrum are used, and a phosphorescence spectrum of the film composed of the plurality of organic semiconductor molecules 25a is measured. Next, a tangent line is drawn with respect to short-wavelength side rising of a phosphorescence spectrum in which the vertical axis represents optical intensity and the horizontal axis represents a wavelength, a wavelength value $\lambda_{edge}$ (nm) of an intersection between the tangent line and the horizontal axis is obtained, and the energy level $E_{T1}$ is obtained from the following Expression (2).

$$E_{T1}(eV)=1239.85/\lambda_{edge} \qquad (2)$$

Note that, the tangent line drawn with respect to the short-wavelength side rising of the phosphorescence spectrum is a tangent line in which an inclination becomes a maximum value among tangent lines drawn at respective points of the phosphorescence spectrum in a range from the short wavelength side of the phosphorescence spectrum to a maximum value of the phosphorescence spectrum appearing on the shortest wavelength side. A maximum value having peak intensity that is 10% or less of maximum peak intensity of the phosphorescence spectrum does not become "the maximum value of the phosphorescence spectrum appearing on the shortest wavelength side".

In each of the plurality of organic semiconductor molecules 25a, the intersystem crossing rate constant $k_{ISC}$ from the lowest excited singlet state $S_1$ to the lowest excited triplet state $T_1$ is greater than the radiative decay rate constant $k^S_r$ from the lowest excited singlet state $S_1$ to the ground state $S_0$. In each of the plurality of organic semiconductor molecules 25a, the intersystem crossing rate constant $k_{ISC}$ from the lowest excited singlet state $S_1$ to the lowest excited triplet state $T_1$ is greater than the reverse intersystem crossing rate constant $k_{RISC}$ from the lowest excited triplet state $T_1$ to the lowest excited singlet state $S_1$. In each of the plurality of organic semiconductor molecules 25a, the intersystem crossing rate constant $k_{ISC}$ from the lowest excited singlet state $S_1$ to the lowest excited triplet state $T_1$ is two or more times the reverse intersystem crossing rate constant $k_{RISC}$ from the lowest excited triplet state $T_1$ to the lowest excited singlet state $S_1$. In each of the plurality of organic semiconductor molecules 25a, the reverse intersystem crossing rate constant $k_{RISC}$ from the lowest excited triplet state $T_1$ to the lowest excited singlet state $S_1$ is $1\times10^7$ $(sec^{-1})$ or less.

The radiative decay rate constant $k^S_r$ from the lowest excited singlet state $S_1$ to the ground state $S_0$, the intersystem crossing rate constant $k_{ISC}$ from the lowest excited singlet state $S_1$ to the lowest excited triplet state $T_1$, and the reverse intersystem crossing rate constant $k_{RISC}$ from the lowest excited triplet state $T_1$ to the lowest excited singlet state $S_1$ are obtained as follows. First, a film composed of the plurality of organic semiconductor molecules 25a is formed on a quartz substrate. In the case of performing film formation by an evaporation method, a film thickness is preferably 50 to 100 nm. In the case of performing film formation by a spin coating method, the film thickness may be approximately 30 nm. Next, a light-emission quantum yield (the number of light-emitting photons/the number of light-absorbing photons) of the film composed of the plurality of organic semiconductor molecules 25a is measured at normal temperature (300 K) by using an absolute PL quantum yield measuring instrument (C11347, manufactured by HAMAMATSU PHOTONICS K.K.). In the measurement, excitation is performed with light in an absorption wavelength band of the film composed of the plurality of organic semiconductor molecules 25a, a light-emission quantum yield is calculated from a light-emission spectrum detected under a condition in which absorbance ("Abs" in the measuring instrument) becomes 0.1 to 0.9, and an average value in measurement performed three times is set as "Φ".

Next, a fluorescence lifetime of the film composed of the plurality of organic semiconductor molecules 25a is measured by using a small-sized fluorescence lifetime measuring instrument (C11367, manufactured by HAMAMATSU PHOTONICS K.K.). In the measurement, excitation is performed with light in the absorption wavelength band of the film composed of the plurality of organic semiconductor molecules 25a, a peak wavelength of a light-emission spectrum obtained in measurement of a light-emission quantum yield is set as "detection wavelength". Note that, all measurements are performed in the number of times of integration so that a peak count becomes 10,000 or greater. In the film composed of the plurality of organic semiconductor molecules 25a, among a lifetime of prompt fluorescence component $(\tau_p)$ that emits light from the lowest excited singlet state $S_1$ without through the lowest excited triplet state $T_1$, an intersystem crossing rate from the lowest excited singlet state $S_1$ to the lowest excited triplet state $T_1$, and a lifetime of delay fluorescence component $(\tau_d)$ that emits light after through reverse intersystem crossing from the lowest excited triplet state $T_1$ to the lowest excited singlet state $S_1$, at least two components are measured. However, it is necessary to perform measurement in a time range suitable for each time scale, and thus measurement is performed in the following procedure.

First, a fluorescence lifetime is measured in a time range in which $\tau_d$ (sec) can be measured in the film composed of the plurality of organic semiconductor molecules 25a. Since it is necessary to view a time-resolved light-emission waveform of excitation light when calculating reasonable $\tau_d$, Spectron (standard diffusion reflection plate) is set as a measurement target, and an instrument response function (IRF) is measured under the same measurement conditions (an excitation wavelength, a repetition frequency, and a time range) as in the measurement of the fluorescence lifetime. Next, $1^{st}$ order "Tail fit" (exponential function fitting of a single component) in a measurement instrument is performed with respect to a previously measured molecular light-emission decay curve, and $\tau_d$ (sec) is calculated. With regard to a calculation range when performing the Tail fit, after performing measurement in a time range sufficiently wider than an excitation pulse width obtained in the IRF measurement, calculation is performed in a time region capable of obtaining S/N of light-emission intensity (a region in which an average value of light-emission intensity of 21 points including 10 point before and after time of interest is greater by 5 counts with respect to a dark level) after a late time between time when a light-emission decay curve of a prompt component is sufficiently attenuated or after time when excitation pulse light is attenuated to a dark level.

Next, in order to calculate $\tau_p$, measurement on the film composed of the plurality of organic semiconductor molecules 25a is performed in a time range (for example, one microsecond) in which time resolution of the light-emission curve of the prompt component can be sufficiently secured, and a light-emission decay curve of a delay component is also included. Next, the IRF is measured under the same conditions with Spectron set as a measurement target, a multi-component exponential function fitting is performed with previously obtained td set as a fixed parameter, and $\tau_p$ (sec), and a ratio of the prompt and delay components are calculated. Note that, with regard to the prompt component, a light-emission decay process of two or more components may be included due to intermolecular interaction. In this case, fitting is performed with three or more components including the prompt and delay components, but light-emission decay without through reverse intersystem crossing is defined as a prompt component and is calculated. A fitting method conforms to a method described in manual of C11367.

Since a prompt component $\Phi_p$ and a delay component $\Phi_d$ of the light-emission quantum yield ($\Phi=\Phi_p+\Phi_d$), and a prompt component $\tau_p$ and a delay component $\tau_d$ of the fluorescence lifetime are obtained through the above-described measurement, various rate constants ($k^S_r$, $k_{ISC}$, $k_{RISC}$) are calculated by the following Expressions (3) to (7) (however, non-radiative deactivation from the lowest excited singlet state $S_1$ is ignored).

$$\tau_p=1/k_p \tag{3}$$

$$\tau_d=1/k_d \tag{4}$$

$$k^S_r=\Phi_p k_p \tag{5}$$

$$k_{ISC}=(1-\Phi_p)k_p \tag{6}$$

$$k_{RISC}=(k_p k_d \Phi_d)/(k_{ISC}\Phi_p) \tag{7}$$

Note that, in a case where an ideal molecular design as a light-receiving material is realized, $k^S_r$ is expected to be significantly lower than $k_{ISC}$, and as a result, light-emission intensity of the prompt component is attenuated, and $T_1$ generation efficiency increases. Under this condition, in a case where klusc is small and a nonradiative decay rate constant $k^T_{nr}$ from $T_1$ is significantly smaller than $k_{RISC}$, a very long light-emission lifetime is observed. In the case of this condition, sufficient S/N for rate constant calculation may not be obtained in fluorescence lifetime measurement, but this is a phenomenon that can be regarded as convergence to ideal conditions ($k_{RISC}\rightarrow0$). In addition, in a polar organic semiconductor molecules having a dipole moment of 0 D or greater, since a phenomenon in which excited molecules formed by photoexcitation in a film does not contribute to light-emission and is spontaneously decomposed to charges may occur, there is a possibility that the components are not measured as light-emission, and sufficient S/N for rate constant calculation may not be obtained in the fluorescence lifetime measurement.

A dipole moment ($\mu$) of each of the plurality of organic semiconductor molecules 25a is greater than 0 D. The dipole moment is a value that can be calculated by quantum chemistry calculation, and is a value that is typically calculated by a calculation method called a Hartree-Fock (HF) method or a density functional theory (DFT) method. Among these, the most commonly used condition (a combination of the functional theory and a basis function) is B3LYP/6-31(d).

Examples of the organic semiconductor molecules 25a that satisfy the above-described conditions include TADF molecule such as TPA-DCPP, 4CzIPN, and 4CzTPN. The TADF molecule is a molecule that is known in a light-emission field, but can be used as the organic semiconductor molecules 25a that satisfy the above-described conditions. The organic semiconductor molecules 25a are designed by quantum chemistry calculation or the like so as to satisfy the above-described conditions, and are generated by organic synthesis. Note that, examples of the host molecules 25b that satisfy the above-described conditions include CBP, mCBP, T2T, mCP, PPT, DPEPO, and the like.

In the organic light-receiving layer 25 configured as described above, an excited state enabling reverse intersystem crossing from the lowest excited triplet state $T_1$ to the lowest excited singlet state $S_1$ is formed in each of the plurality of organic semiconductor molecules 25a due to irradiation with light. According to this, in each of the plurality of organic semiconductor molecules 25a, in addition to direct charge separation from the lowest excited singlet state $S_1$, charge separation from the lowest excited triplet state $T_1$ having a longer lifetime in comparison to the lowest excited singlet state $S_1$ (hereinafter, referred to as "direct charge separation from lowest excited triplet state $T_1$"), and/or charge separation from the lowest excited singlet state $S_1$ in which the lowest excited triplet state $T_1$ having a longer lifetime in comparison to the lowest excited singlet state $S_1$ is set as a temporary shelter from deactivation (hereinafter, referred to as "charge separation from the lowest excited singlet state $S_1$ through the lowest excited triplet state $T_1$") occur.

Figure 3:
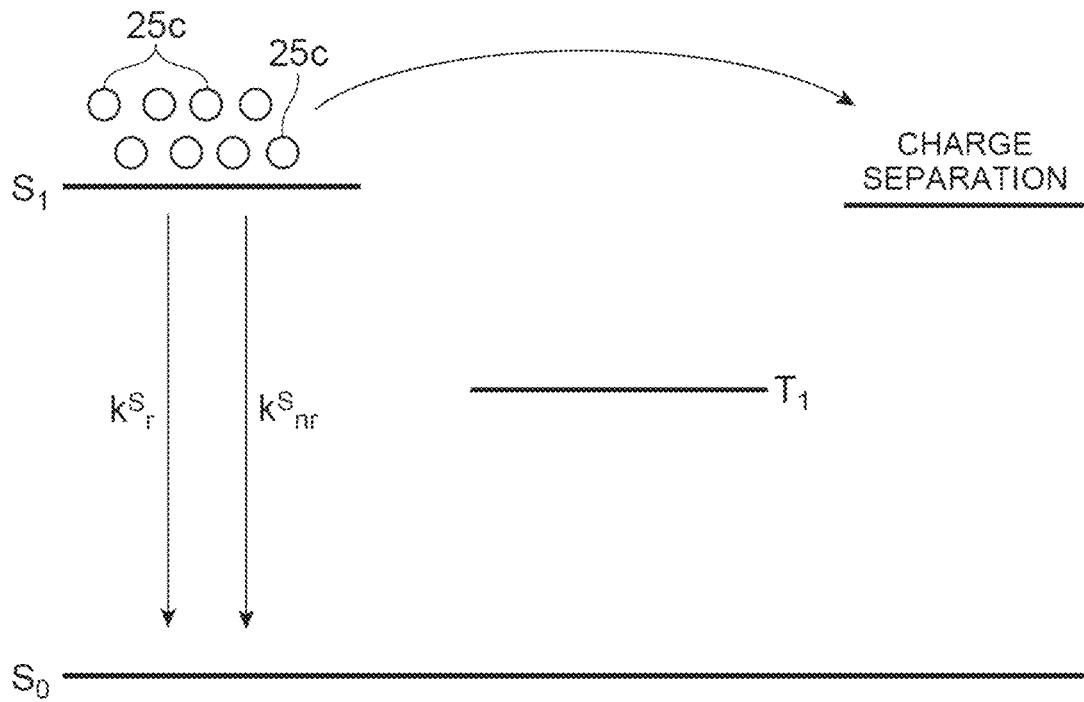
FIG. 3 is an energy diagram of an organic light-receiving layer according to a comparative example.

FIG. 3 is an energy diagram of an organic light-receiving layer according to a comparative example. The organic light-receiving layer according to the comparative example illustrated in FIG. 3 contains a plurality of organic semiconductor molecules 25c. The organic semiconductor molecules 25c are fluorescent molecules (for example, Alq3 and the like). In the organic light-receiving layer according to the comparative example illustrated in FIG. 3, a difference between energy of the lowest excited singlet state $S_1$ and energy of the lowest excited triplet state $T_1$ at an absolute temperature of 77 K is large, and even when being irradiated with light, the intersystem crossing from the lowest excited singlet state $S_1$ to the lowest excited triplet state $T_1$ does not occur in each of the organic semiconductor molecules 25c. Therefore, neither direct charge separation from the lowest excited triplet state $T_1$ nor charge separation from the lowest excited singlet state $S_1$ through the lowest excited triplet state $T_1$ occurs. Accordingly, in the organic light-receiving layer of a comparative example as illustrated in FIG. 3, a dissociation efficiency to charges decreases, and components which are lost as light or heat are increased. As a result, the organic light-receiving layer according to the comparative example illustrated in FIG. 3 does not function as an effective light-receiving layer.

As described above, in the organic light-receiving element 2, an excited state enabling reverse intersystem crossing from the lowest excited triplet state $T_1$ to the lowest excited singlet state $S_1$ is formed in each of the plurality of organic semiconductor molecules 25a due to irradiation with light. That is, due to irradiation with light, an excited state enabling the reverse intersystem crossing from the lowest excited triplet state $T_1$ to the lowest excited singlet state $S_1$ is formed in each of the organic semiconductor molecules 25a. According to this, with respect to each of the plurality of organic semiconductor molecules 25a, in addition to direct charge separation from the lowest excited singlet state $S_1$, direct charge separation from lowest excited triplet state $T_1$ and/or charge separation from the lowest excited singlet state $S_1$ through the lowest excited triplet state $T_1$ become possible. Accordingly, according to the organic light-receiving element 2, sufficient charge separation can be obtained.

In the organic light-receiving element 2, an excited state enabling the reverse intersystem crossing from the lowest excited triplet state $T_1$ to the lowest excited singlet state $S_1$ is formed in each of the organic semiconductor molecules 25a due to irradiation with light differently from a photoelectric conversion layer employing bulk heterojunction, a high open circuit voltage is likely to be obtained in comparison to the photoelectric conversion layer employing the bulk heterojunction. In addition, in the photoelectric conversion layer employing the bulk heterojunction, it is necessary to mix donor molecules and acceptor molecules in order for an area of an interface of the bulk heterojunction not to decrease, but in the organic light-receiving element 2, the restriction is not necessary.

In the organic light-receiving element 2, in each of the plurality of organic semiconductor molecules 25*a*, a difference between energy of the lowest excited singlet state $S_1$ and energy of the lowest excited triplet state $T_1$ at an absolute temperature of 77 K is less than 0.3 eV. According to this, each of the organic semiconductor molecules 25*a* can be caused to function as molecules in which an excited state enabling reverse intersystem crossing from the lowest excited triplet state $T_1$ to the lowest excited singlet state $S_1$ is formed due to irradiation with light.

In the organic light-receiving element 2, in each of the plurality of organic semiconductor molecules 25*a*, the inter-system crossing rate constant $k_{ISC}$ from the lowest excited singlet state $S_1$ to the lowest excited triplet state $T_1$ is greater than the radiative decay rate constant $k^S_r$ from the lowest excited singlet state $S_1$ to the ground state $S_0$. According to this, direct charge separation from the lowest excited triplet state $T_1$ and/or charge separation from the lowest excited singlet state $S_1$ through the lowest excited triplet state $T_1$ become possible while suppressing deactivation from the lowest excited singlet state $S_1$ due to light-emission.

In the organic light-receiving element 2, in each of the plurality of organic semiconductor molecules 25*a*, the inter-system crossing rate constant $k_{ISC}$ from the lowest excited singlet state $S_1$ to the lowest excited triplet state $T_1$ is greater than the reverse intersystem crossing rate constant $k_{RISC}$ from the lowest excited triplet state $T_1$ to the lowest excited singlet state $S_1$. According to this, the lifetime of the lowest excited triplet state $T_1$ is lengthened, and thus photoelectric conversion efficiency can be improved.

In the organic light-receiving element 2, in each of the plurality of organic semiconductor molecules 25*a*, the inter-system crossing rate constant $k_{ISC}$ from the lowest excited singlet state $S_1$ to the lowest excited triplet state $T_1$ is two or more times the reverse intersystem crossing rate constant $k_{RISC}$ from the lowest excited triplet state $T_1$ to the lowest excited singlet state $S_1$. According to this, the lifetime of the lowest excited triplet state $T_1$ is lengthened, and thus photoelectric conversion efficiency can be improved.

In the organic light-receiving element 2, in each of the plurality of organic semiconductor molecules 25*a*, the reverse intersystem crossing rate constant $k_{RISC}$ from the lowest excited triplet state $T_1$ to the lowest excited singlet state $S_1$ is $1 \times 10^7$ (sec$^{-1}$) or less. According to this, the lifetime of the lowest excited triplet state $T_1$ is lengthened, and thus photoelectric conversion efficiency can be improved.

In the organic light-receiving element 2, a dipole moment of each of the plurality of organic semiconductor molecules 25*a* is greater than 0 D. According to this, energy for charge separation can be reduced.

In the organic light-receiving element 2, energy of the lowest excited triplet state $T_1$ at an absolute temperature of 77 K in each of the plurality of host molecules 25*b* is higher than energy of the lowest excited triplet state $T_1$ at an absolute temperature of 77 K in each of the plurality of organic semiconductor molecules 25*a*. According to this, transition of excited molecules from the lowest excited triplet state $T_1$ of the organic semiconductor molecules 25*a* to the lowest excited triplet state $T_1$ of the host molecules 25*b*, and a loss path of the host molecules 25*b* in the lowest excited triplet state $T_1$ in a case where an excited state is reformed due to recoupling of charges generated by charge separation are suppressed. That is, it is possible to suppress a decrease in photoelectric conversion efficiency due to an influence of the plurality of host molecules 25*b*.

In the organic light-receiving element 2, the first electrode 21 is disposed on one side of the organic light-receiving layer 25, and the second electrode 22 is disposed on the other side of the organic light-receiving layer 25. According to this, it is possible to detect a current that is generated due to charge separation.

In the organic light-receiving element 2, the first electrode 21 has the light-transmitting property with respect to light emitted to the organic light-receiving layer 25. According to this, it is possible to reliably cause light to be incident to the organic light-receiving layer 25.

In the light-receiving device 1, the controller 3 applies a voltage between the first electrode 21 and the second electrode 22 in a light-receiving period so that an electric field in a direction of causing charge separation occurs in the organic light-receiving layer 25, and detects a current. According to this, charge separation with more efficiency becomes possible in the organic light-receiving layer 25, and thus it is possible to detect a current with more efficiency in the light-receiving period.

Figure 4:
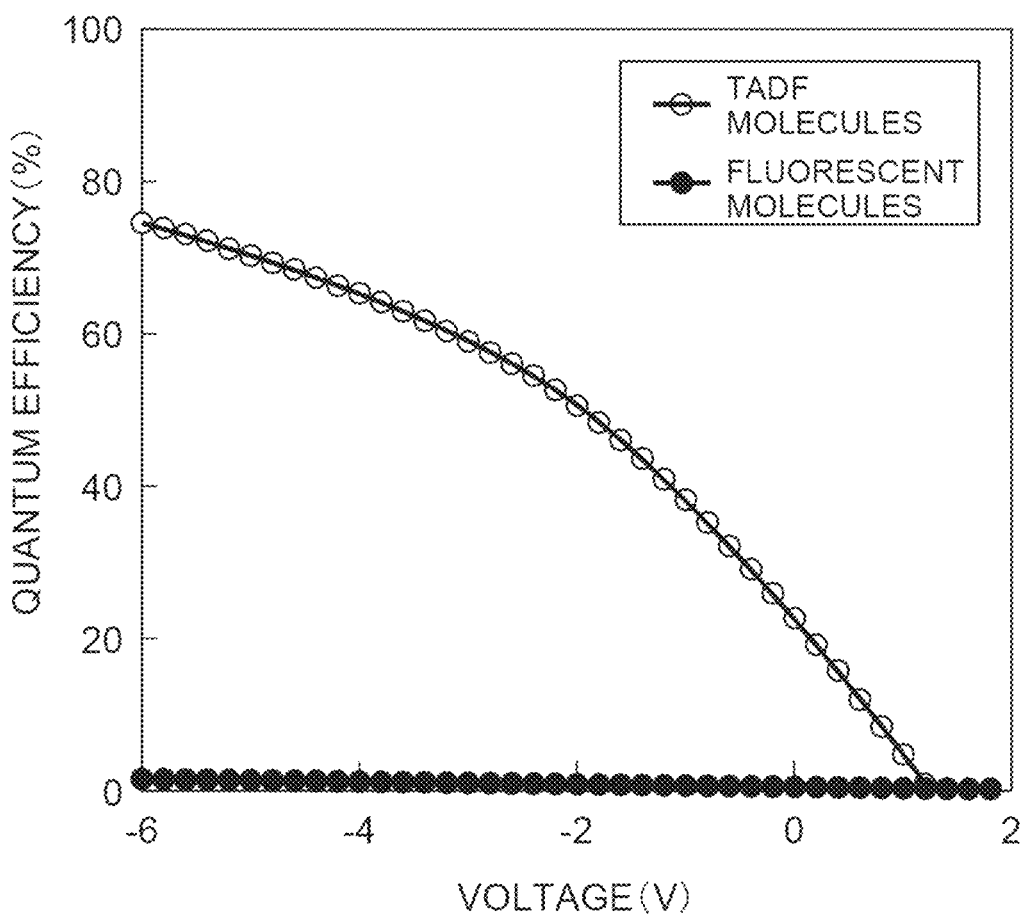
FIG. 4 is a graph showing voltage dependency of a quantum efficiency with respect to the organic light-receiving layer that includes a plurality of TADF molecules according to an example, and an organic light-receiving layer that includes a plurality of fluorescent molecules according to the comparative example.

FIG. 4 is a graph showing voltage dependence of a quantum efficiency with respect to the organic light-receiving layer that includes a plurality of TADF molecules according to the example, and the organic light-receiving layer that includes a plurality of fluorescent molecules according to the comparative example. In FIG. 4, "quantum efficiency" is a ratio of "the number of electrons detected from the organic light-receiving layer" to "the number of photons absorbed by the organic light-receiving layer" (the same shall apply hereinafter). In addition, "voltage" is a voltage applied to the organic light-receiving layer at the time of irradiation with light, and a negative value is a value that causes an electric field in a direction of causing charge separation to occur in the organic light-receiving layer (the same shall apply hereinafter). As shown in FIG. 4, in the organic light-receiving layer containing the plurality of TADF molecules according to the example, higher quantum efficiency is obtained in comparison to an organic light-receiving layer of a comparative example containing a plurality of fluorescent molecules.

Figure 5:
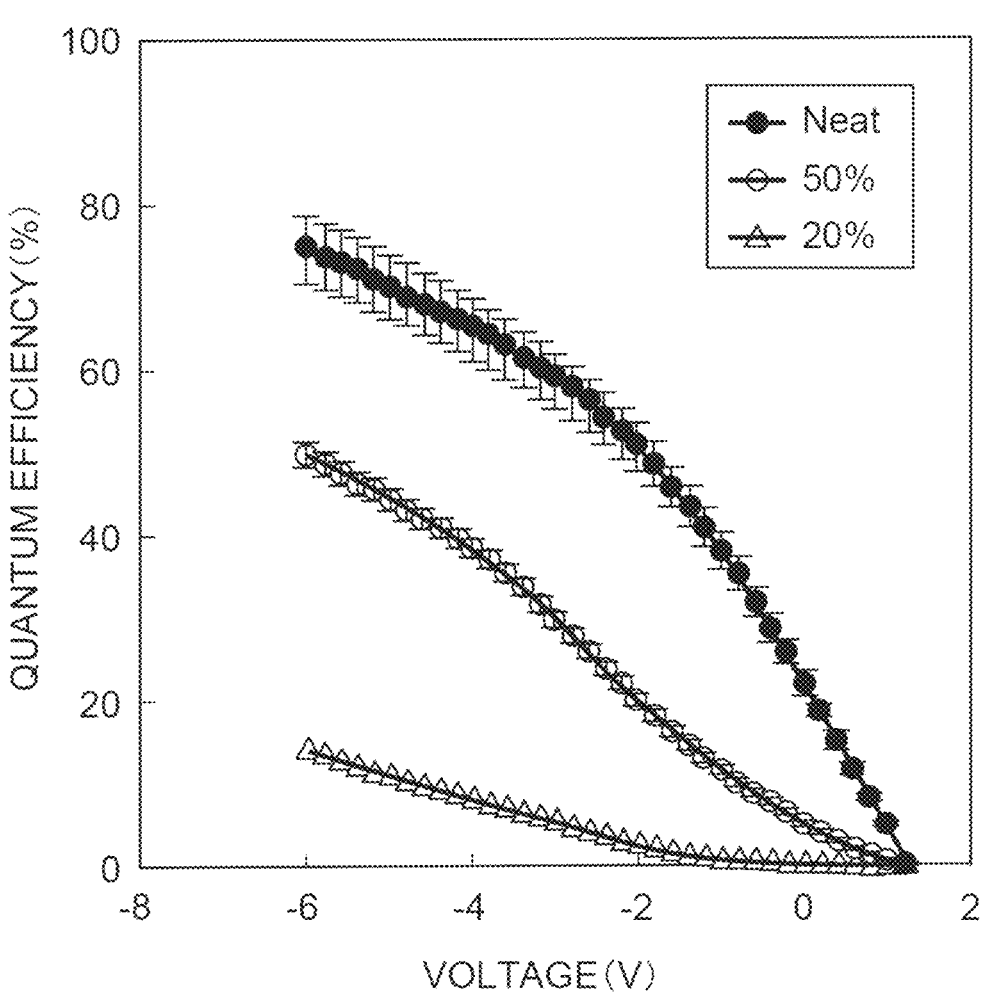
FIG. 5 is a graph showing voltage dependency of a quantum efficiency with respect to an organic light-receiving layer that includes a plurality of TADF molecules in a ratio of 100% according to the example, an organic light-receiving layer that includes a plurality of TADF molecules in a ratio of 50% according to the example, and an organic light-receiving layer that includes a plurality of TADF molecules in a ratio of 20% according to the example.

FIG. 5 is a graph showing voltage dependency of a quantum efficiency with respect to an organic light-receiving layer that includes a plurality of TADF molecules in a ratio of 100% according to the example, an organic light-receiving layer that includes a plurality of TADF molecules in a ratio of 50% according to the example, and an organic light-receiving layer that includes a plurality of TADF molecules in a ratio of 20% according to the example. Here, the ratio of the plurality of TADF molecules represents a mass ratio to a plurality of host molecules contained in the organic light-receiving layer. As shown in FIG. 5, sufficient quantum efficiency is obtained in any organic light-receiving layer. Here, the TADF molecules are TPA-DCPP, and the host molecules are CBP. In this case, the higher a ratio of the plurality of TADF molecules is, the higher quantum efficiency is obtained.

Figure 6:
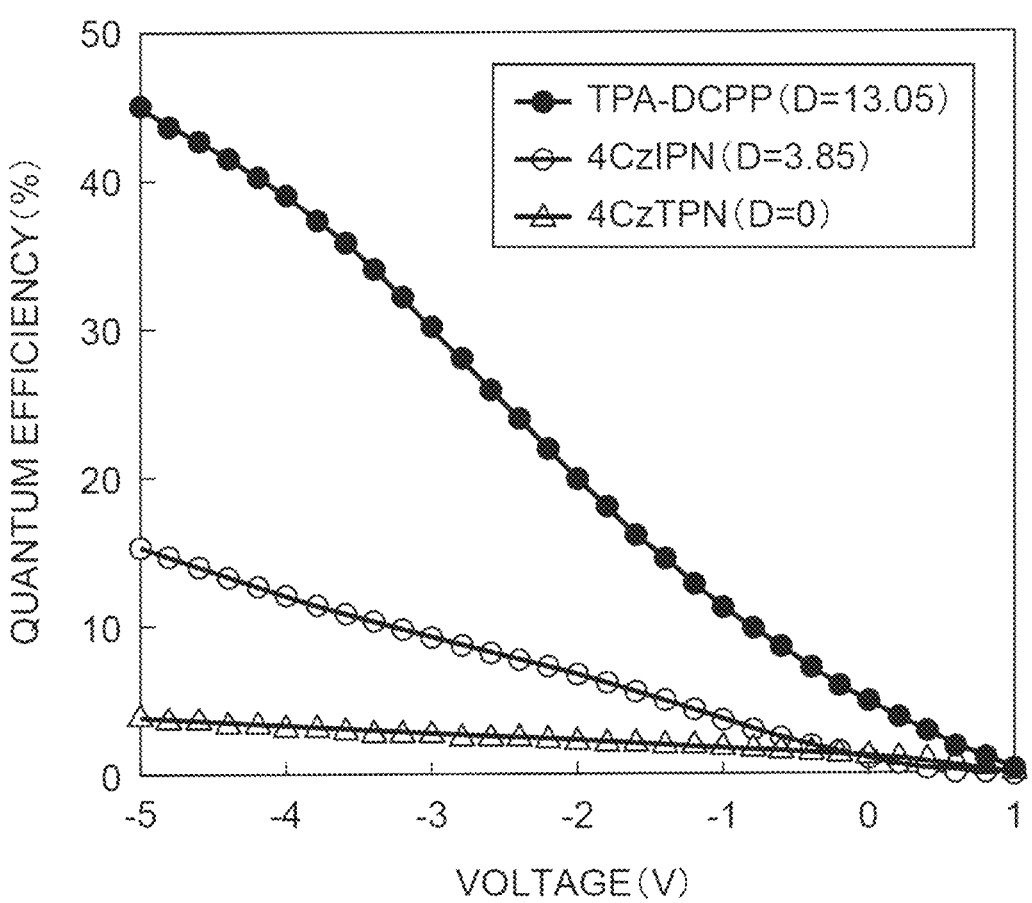
FIG. 6 is a graph showing voltage dependency of a quantum efficiency with respect to an organic light-receiving layer that includes TPA-DCPP as the plurality of TADF molecules according to the example, an organic light-receiving layer that includes 4CzIPN as the plurality of TADF molecules according to the example, and an organic light-receiving layer that includes 4CzTPN as the plurality of TADF molecules according to the example.

FIG. 6 is a graph showing voltage dependency of a quantum efficiency with respect to an organic light-receiving layer that includes TPA-DCPP as the plurality of TADF molecules according to the example, an organic light-receiving layer that includes 4CzIPN as the plurality of TADF molecules according to the example, and an organic light-receiving layer that includes 4CzTPN as the plurality of TADF molecules according to the example. As shown in FIG. 6, sufficient quantum efficiency is obtained in any organic light-receiving layer. A dipole moment of TPA-DCPP is 13.05 D, a dipole moment of 4CzIPN is 3.85 D, and a dipole moment of 4CzTPN is 0 D. Here, the higher the dipole moment is, the higher quantum efficiency is obtained.

Second Embodiment

Figure 7:
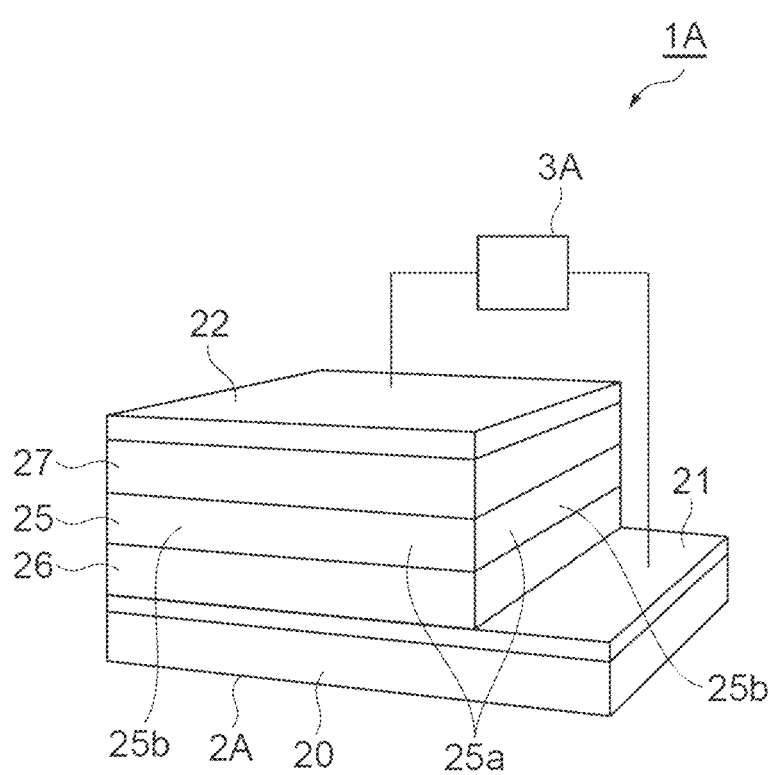
FIG. 7 is a configuration diagram of a light-receiving device of a second embodiment.

FIG. 7 is a configuration diagram of a light-receiving device 1A of a second embodiment. As illustrated in FIG. 7, the light-receiving device 1A includes an organic light-receiving element 2A. The organic light-receiving element 2A is mainly different from the organic light-receiving element 2 according to the first embodiment in that a charge transport layer 26 is disposed at the first position between the organic light-receiving layer 25 and the first electrode 21, and a charge block layer 27 is disposed at the second position between the organic light-receiving layer 25 and the second electrode 22. Hereinafter, the difference from the organic light-receiving element 2 according to the first embodiment will be mainly described, and description of the same configuration as in the organic light-receiving element 2 according to the first embodiment will be omitted.

In a case where the first electrode 21 is caused to function as a positive electrode and the second electrode 22 is caused to function as a negative electrode, the charge transport layer 26 is a hole transport layer. Specifically, the charge transport layer 26 is a layer that promotes movement of holes from the organic light-receiving layer 25 to the first electrode 21, and movement of holes from the first electrode 21 and the organic light-receiving layer 25. The charge transport layer 26 has a light-transmitting property with respect to light emitted to the organic light-receiving layer 25 as in the first electrode 21. For example, the charge transport layer 26 is composed of a hole transport material such as triazole derivatives, imidazole derivatives, carbazole derivatives (CBP, Tris-PCz, or the like), indolocarbazole derivatives, polyarylalkane derivatives, pyrazoline derivatives, pyrazolone derivatives, phenylenediamine derivatives, arylamine derivatives, diphenylamine derivatives (NPD or the like), triphenylamine derivatives (TAPC, TPT1, or the like), amino-substituted chalcone derivatives, oxazole derivatives, styrylanthracene derivatives, fluorenone derivatives, hydrazone derivatives, stilbene derivatives, silazane derivatives, aniline-based copolymers, and highly conductive oligomer. As an example, the charge transport layer 26 has a thickness at which a distance between the first electrode 21 and the charge block layer 27 becomes 400 nm or less.

In a case where the first electrode 21 is caused to function as a positive electrode and the second electrode 22 is caused to function as a negative electrode, the charge block layer 27 is a layer that blocks movement of electrons from the organic light-receiving layer 25 to the second electrode 22. For example, the charge block layer 27 is composed of an electron transport material such as triazine derivatives (T2T or the like), phenanthroline derivatives (Bphen, BCP, or the like), benzimidazole derivatives (TPBi, or the like), nitro-substituted fluorene derivatives, diphenyl quinone derivatives, thiopyran dioxide derivatives, carbodiimides, fluorenylidene methane derivatives, triphenylene derivatives, anthraquinodimethane derivatives, anthrone derivatives, oxadiazole derivatives, thiadiazole derivatives, quinoxaline derivatives, and chelate complexes (BAlq or the like). When the charge block layer 27 is an electron block layer that blocks movement of electrons, the above-described hole transport material can also be used as the material of the charge block layer 27.

The light-receiving device 1A further includes a controller 3A. The controller 3A is electrically connected to the organic light-receiving element 2A. The controller 3A applies a voltage between the first electrode 21 and the second electrode 22 in a light-receiving period so that an electric field in a direction of causing charge separation occurs in the organic light-receiving layer 25. The light-receiving period is a period in which the organic light-receiving layer 25 is irradiated with light of a light-receiving target, and is, for example, a period of 0.1 ns to 10 s. The controller 3A applies a voltage (pulse voltage) between the first electrode 21 and the second electrode 22 in an application period after passage of a holding period from the light-receiving period so that an electric field in a direction opposite to the direction of causing the charge separation occurs in the organic light-receiving layer 25, and detects a current (a displacement current). The holding period is a period from termination of the light-receiving period to initiation of the application period, and is, for example, a period of 100 ns to 100 days. The application period is a period in which a voltage is applied between the first electrode 21 and the second electrode 22 so that an electric field in a direction opposite to the direction of causing the charge separation occurs in the organic light-receiving layer 25, and is, for example, a period of 100 ns to 100 μs. Note that, detection of a current is performed for an arbitrary period (for example, a period of 100 ns to 100 μs) from initiation of the application period.

In a case where the first electrode 21 is caused to function as a positive electrode and the second electrode 22 is caused to function as a negative electrode, the controller 3A may apply a voltage between the first electrode 21 and the second electrode 22 so that a potential of the first electrode 21 becomes negative with a potential of the second electrode 22 set as a reference or the potential of the second electrode 22 becomes positive with the potential of the first electrode 21 set as a reference so as to cause an electric field in a direction of causing charge separation to occur in the organic light-receiving layer 25. In addition, in a case where the first electrode 21 is caused to function as a positive electrode and the second electrode 22 is caused to function as a negative electrode, the controller 3A may apply a voltage between the first electrode 21 and the second electrode 22 so that the potential of the first electrode 21 becomes positive with the potential of the second electrode 22 set as a reference or the potential of the second electrode 22 becomes negative with the potential of the first electrode 21 set as a reference so as to cause an electric field in a direction opposite to the direction of causing charge separation to occur in the organic light-receiving layer 25.

Figure 8:
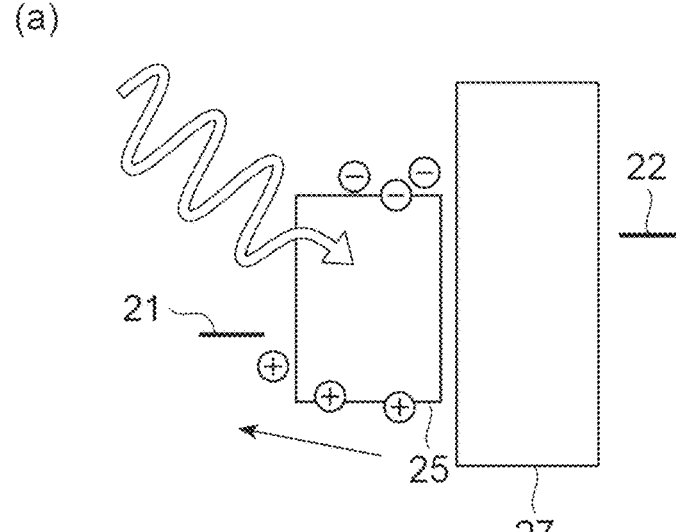
FIG. 8 is an energy diagram of an organic light-receiving element illustrated in FIG. 7.
Figure 8:
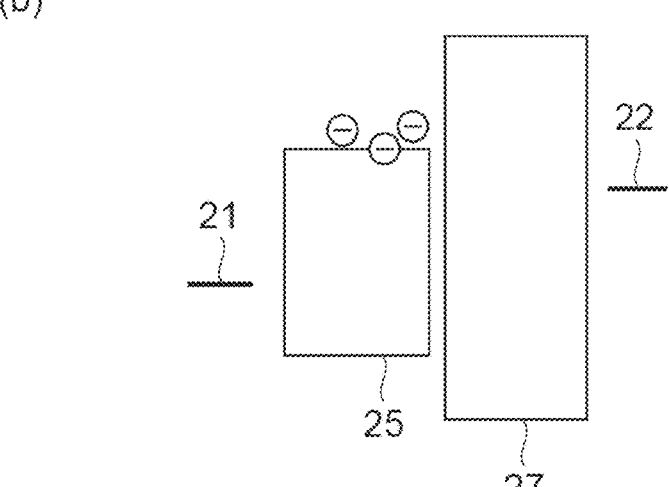
Figure 8:
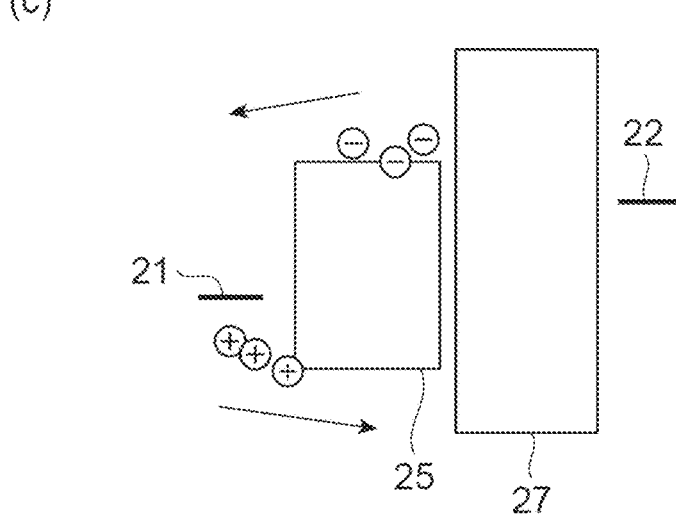

As illustrated in (a) of FIG. 8, in the light-receiving period, in a state in which a voltage is applied between the first electrode 21 and the second electrode 22 so that an electric field in a direction of causing charge separation occurs in the organic light-receiving layer 25, when the organic light-receiving layer 25 is irradiated with light of a light-receiving target, charge separation occurs in the organic light-receiving layer 25, electrons generated due to the charge separation are suppressed from moving to the second electrode 22 due to the charge block layer 27 and stay in the organic light-receiving layer 25, and holes generated due to the charge separation move to the first electrode 21. As illustrated in (b) of FIG. 8, in the holding period, the state in which electrons generated due to the charge separation stay in the organic light-receiving layer 25 is maintained. As illustrated in (c) of FIG. 8, when a voltage is applied between the first electrode 21 and the second electrode 22 in the application period after passage of the holding period from the light-receiving period so that an electric field in a direction opposite to the direction of causing the charge separation occurs in the organic light-receiving layer 25, holes move from the first electrode 21 to the organic light-receiving layer 25, and are coupled to electrons staying in the organic light-receiving layer 25. The controller 3A detects a current that is generated when the holes moved to the organic light-receiving layer 25 are coupled to the electrons staying in the organic light-receiving layer 25. Note that, illustration of the charge transport layer 26 is omitted in (a), (b), and (c) of FIG. 8.

According to the organic light-receiving element 2A configured as described above, sufficient charge separation can also be obtained as in the organic light-receiving element 2 according to the first embodiment.

In the organic light-receiving element 2A, the charge block layer 27 is disposed at the second position between the organic light-receiving layer 25 and the second electrode 22. According to this, for example, in a state in which a voltage is applied between the first electrode 21 and the second electrode 22 so that an electric field in a direction of causing charge separation occurs in the organic light-receiving layer 25, when the charge separation occurs in the organic light-receiving layer 25 due to incidence of light, electrons generated due to the charge separation are suppressed from moving to the second electrode 22 due to the charge block layer 27 and stay in the organic light-receiving layer 25, and holes generated due to the charge separation move to the first electrode 21. After a certain amount of time has passed in this state, for example, when a voltage is applied between the first electrode 21 and the second electrode 22 so that an electric field in a direction opposite to the direction of causing the charge separation occurs in the organic light-receiving layer 25, the holes move from the first electrode 21 to the organic light-receiving layer 25, and are coupled to the electrons staying in the organic light-receiving layer 25. When the holes moved to the organic light-receiving layer 25 are coupled to the electrons staying in the organic light-receiving layer 25, a current is generated, and thus the organic light-receiving element 2A can be caused to function as an optical memory element by detecting the current.

In the organic light-receiving element 2A, the charge transport layer 26 is disposed at the first position between the organic light-receiving layer 25 and the first electrode 21. According to this, it is possible to efficiently move the holes from the organic light-receiving layer 25 to the first electrode 21. In addition, it is possible to efficiently move the holes from the first electrode 21 to the organic light-receiving layer 25.

In the light-receiving device 1A, the controller 3A applies a voltage between the first electrode 21 and the second electrode 22 in the light-receiving period so that an electric field in a direction of causing charge separation occurs in the organic light-receiving layer 25, and applies a voltage between the first electrode 21 and the second electrode 22 in the application period after passage of the holding period from the light-receiving period so that an electric field in a direction opposite to the direction of causing the charge separation occurs in the organic light-receiving layer 25, and detects a current. According to this, in the organic light-receiving layer 25, charge separation becomes possible with more efficiency, and thus it is possible to detect a current with more efficiency after passage of the holding period from the light-receiving period.

Figure 9:
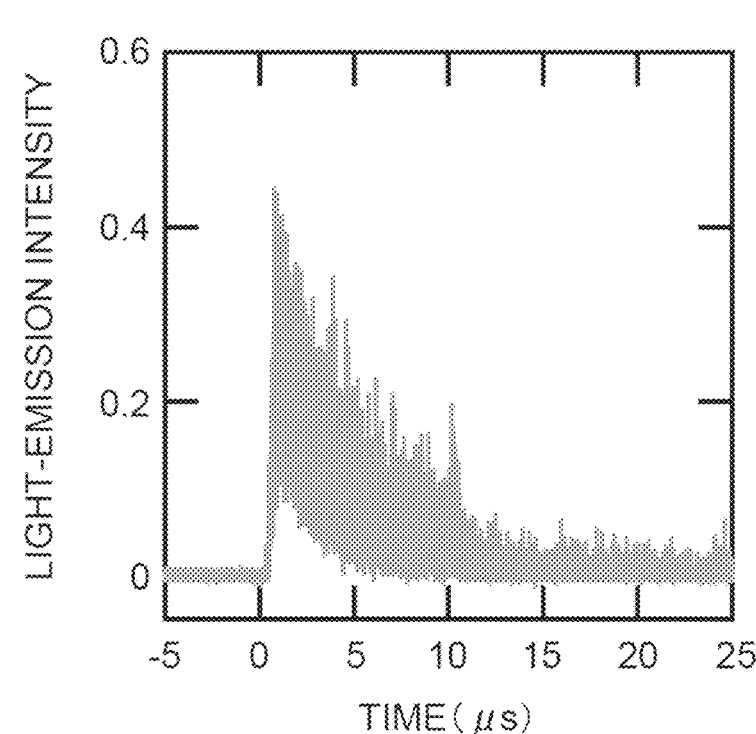
FIG. 9 is a graph showing a variation of the light-emission intensity with the passage of time with respect to an organic light-receiving element of an example.
Figure 9:
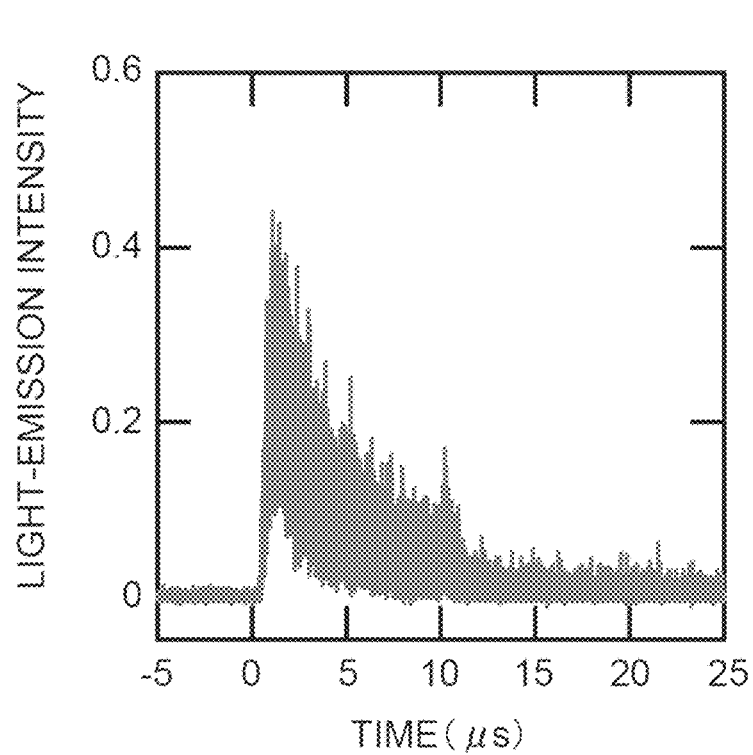

(a) and (b) of FIG. 9 are graphs showing a variation of the light-emission intensity with the passage of time with respect to an organic light-receiving element of an example. Here, as the organic light-receiving element of the example, "an organic light-receiving element 2A in which the first electrode 21 is composed of ITO, the second electrode 22 is composed of Al, the organic light-receiving layer 25 is composed of TPA-DCPP (organic light-emitting substance) and mCBP (host material), the charge transport layer 26 is composed of TAPC, and the charge block layer 27 is composed of T2T" was prepared. In addition, in a light-receiving period of 500 μs, a voltage of −2 V was applied to the first electrode 21 with the second electrode 22 set as a reference, and in an application period of 10 μs after passage of a holding period from the light-receiving period, a voltage of +10 V was applied to the first electrode 21 with the second electrode 22 set as a reference. As a result, even in a case where the holding period is set to 0.1 s ((a) of FIG. 9), or even in a case where the holding period is set to three days ((b) of FIG. 9), light-emission was observed after 0 μs that is initiation time of the application period. The light-emission occurs when holes moved to the organic light-receiving layer 25 due to application of a voltage of +10 V to the first electrode 21 with the second electrode 22 set as a reference are coupled to electrons staying in the organic light-receiving layer 25. That is, the light-emission represents that the electrons generated due to the charge separation stayed in the organic light-receiving layer 25 even in the case where the holding period is set to 0.1 s ((a) of FIG. 9), or even in the case where the holding period is set to three days ((b) of FIG. 9). Note that, in the organic light-receiving element 2A, the light-emission is not essential, but the light-emission may occur.

Figure 10:
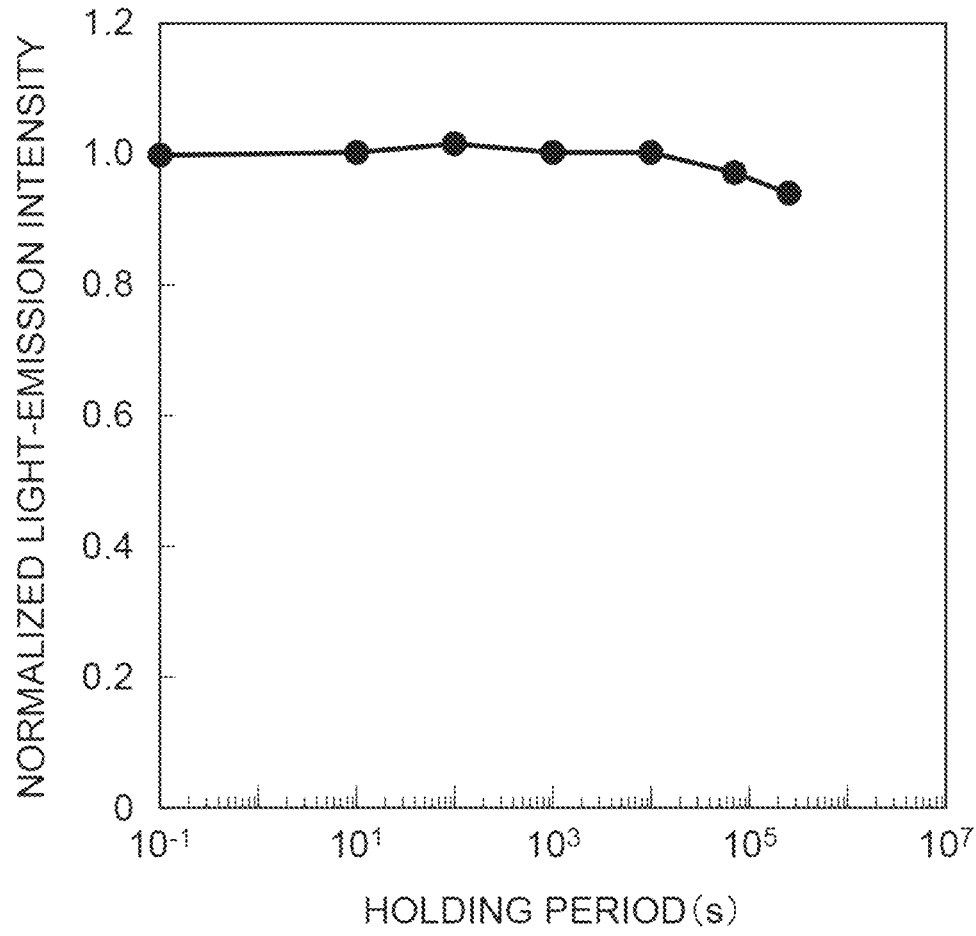
FIG. 10 is a graph showing a relationship between a holding period and a normalized light-emission intensity with respect to the organic light-receiving element of the example.

When a light-emission intensity is normalized with respect to light-emission observed after 0 μs that is initiation time of the application period by changing the holding period, results shown in FIG. 10 are obtained. FIG. 10 is a graph showing a relationship between a holding period and a normalized light-emission intensity with respect to the organic light-receiving element of the example. It can be seen that electrons generated due to the charge separation stayed in the organic light-receiving layer 25 even in any holding period indicated by a black circle in the graph.

Figure 11:
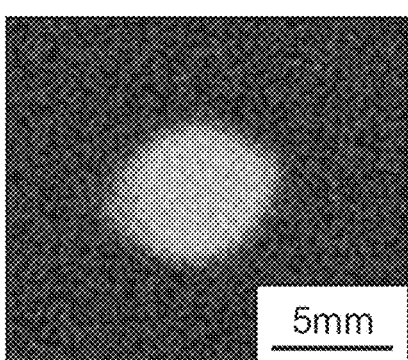
FIG. 11 is a photograph showing a light-emission state with respect to an organic light-receiving element of an example.
Figure 11:
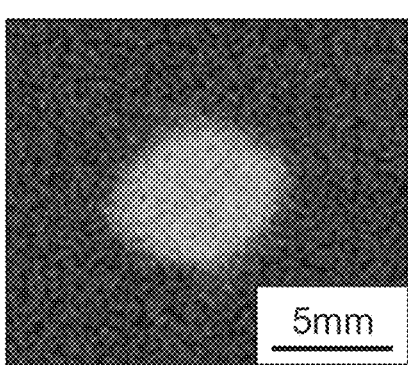
Figure 11:
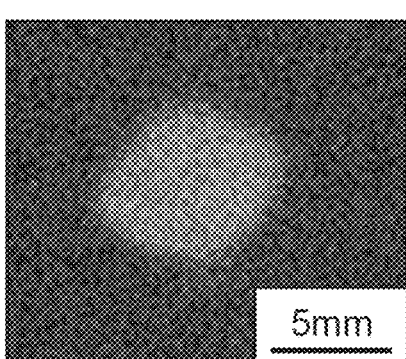
Figure 11:
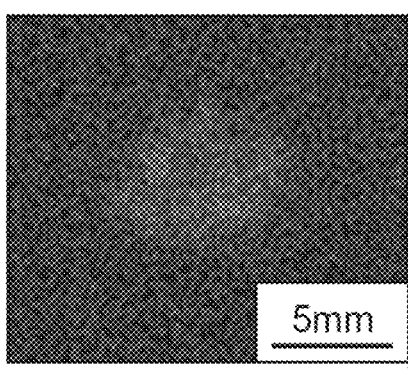
Figure 12:
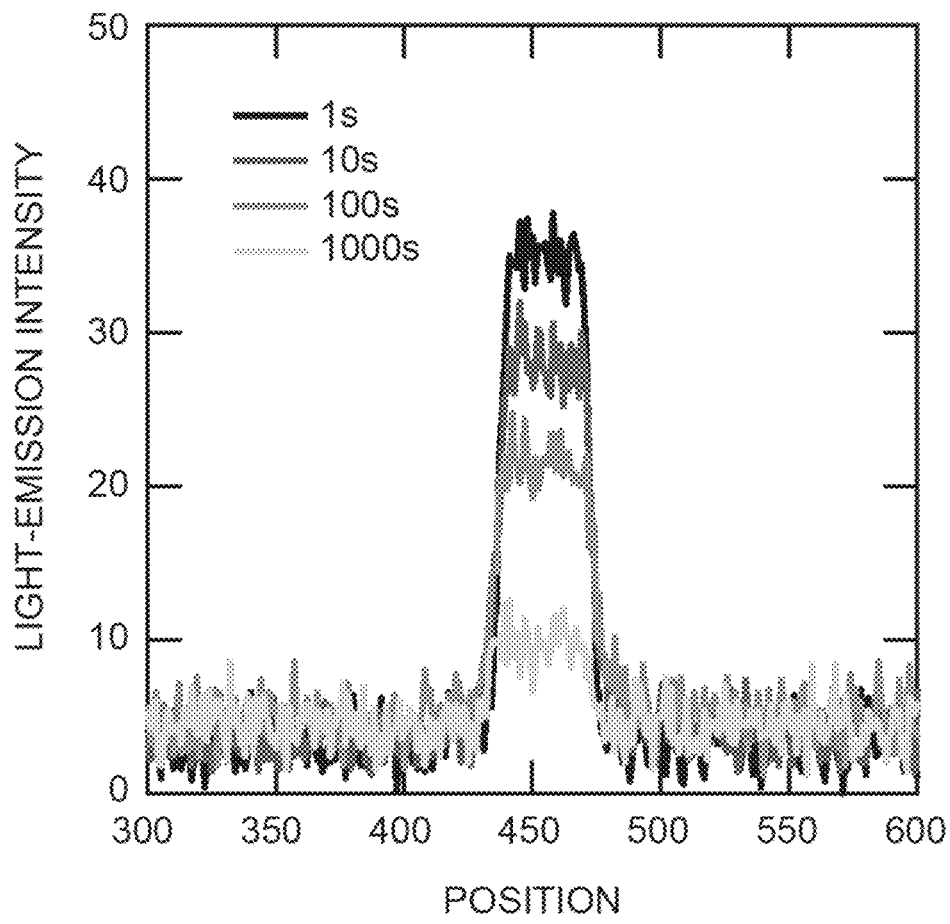
FIG. 12 is a graph showing a relationship between a position and a light-emission intensity with respect to the organic light-receiving element of the example.

(a), (b), (c), and (d) of FIG. 11 are photographs showing a light-emission state with respect to an organic light-receiving element of an example. Here, as the organic light-receiving element of the example, the same organic light-receiving element 2A as in the case of obtaining the results shown in (a) and (b) of FIG. 9 was employed. A difference between (a), (b), (c), and (d) of FIG. 11 is in the holding period, and the holding period of (a), (b), (c), and (d) of FIG. 11 is set to 1 s, 10 s, 100 s, and 1000 s, respectively. FIG. 12 is a graph showing a relationship between a position and a light-emission intensity with respect to an organic light-receiving element of an example. The horizontal axis of the graph shown in FIG. 12 represents positions along central lines of the respective photographs in (a), (b), (c), and (d) of FIG. 11. As described above, it can be seen that electrons generated due to the charge separation stayed in a certain region in the organic light-receiving layer 25 (that is, spatially held) even in any holding period.

The organic light-receiving element 2A described above corresponds to a case where the first electrode 21 is caused to function as a positive electrode and the second electrode 22 is caused to function as a negative electrode, but the first electrode 21 may be caused to function as a negative electrode and the second electrode 22 may be caused to function as a positive electrode. In this case, the charge block layer 27 is disposed at the first position between the organic light-receiving layer 25 and the first electrode 21, and the charge transport layer 26 is disposed at the second position between the organic light-receiving layer 25 and the second electrode 22. In a case where the first electrode 21 is caused to function as a negative electrode and the second electrode 22 is caused to function as a positive electrode, the charge block layer 27 is a layer that blocks movement of holes from the organic light-receiving layer 25 to the first electrode 21. The charge block layer 27 has a light-transmitting property with respect to light emitted to the organic light-receiving layer 25 as in the first electrode 21. In a case where the charge block layer 27 is a hole block layer that blocks movement of holes, as a material of the charge block layer 27, the above-described electron transport material can be used. In addition, in a case where the first electrode 21 is caused to function as a negative electrode and the second electrode 22 is caused to function as a positive electrode, the charge transport layer 26 is an electron transport layer. That is, the charge transport layer 26 is a layer that promotes movement of electrons from the organic light-receiving layer 25 to the second electrode 22 and movement of electrons from the second electrode 22 to the organic light-receiving layer 25. In a case where the charge transport layer 26 is an electron transport layer that promotes movement of electrons, as a material of the charge transport layer 26, the above-described electron transport material can be used.

Figure 13:
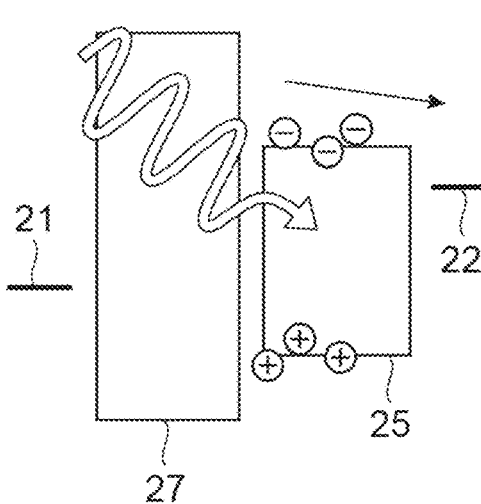
FIG. 13 is an energy diagram of an organic light-receiving element of a modified example.
Figure 13:
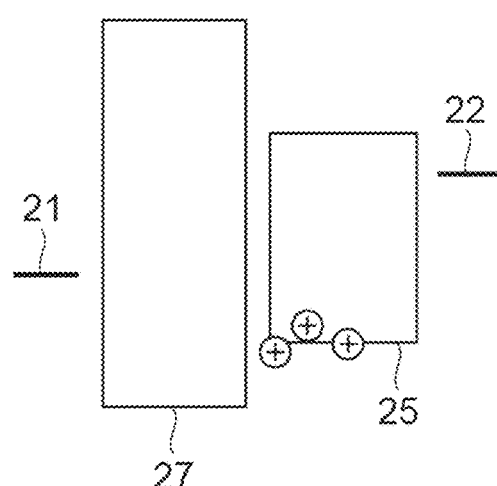
Figure 13:
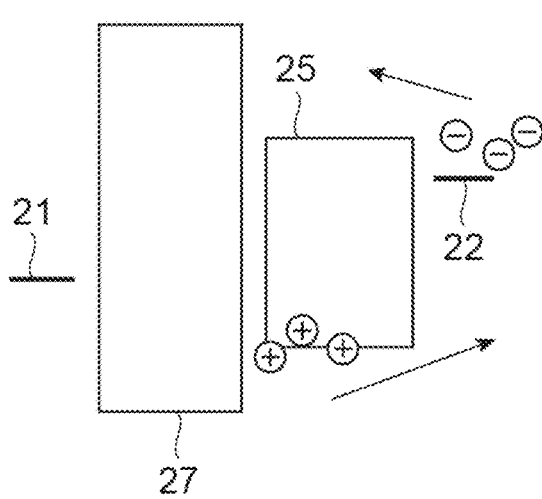

In a case where the first electrode 21 is caused to function as a negative electrode and the second electrode 22 is caused to function as a positive electrode, as illustrated in (a) of FIG. 13, in the light-receiving period, in a state in which a voltage is applied between the first electrode 21 and the second electrode 22 so that an electric field in a direction of causing charge separation occurs in the organic light-receiving layer 25, when the organic light-receiving layer 25 is irradiated with light of a light-receiving target, charge separation occurs in the organic light-receiving layer 25, holes generated due to the charge separation are suppressed from moving to the first electrode 21 due to the charge block layer 27 and stay in the organic light-receiving layer 25, and electrons generated due to the charge separation move to the second electrode 22. As illustrated in (b) of FIG. 13, in the holding period, a state in which holes generated due to the charge separation stay in the organic light-receiving layer 25 is maintained. As illustrated in (c) of FIG. 13, in the application period after passage of the holding period from the light-receiving period, when a voltage is applied between the first electrode 21 and the second electrode 22 so that an electric field in a direction opposite to the direction of causing the charge separation occurs in the organic light-receiving layer 25, electrons move from the second electrode 22 to the organic light-receiving layer 25 and are coupled to holes staying in the organic light-receiving layer 25. The controller 3A detects a current that is generated when the electrons moved to the organic light-receiving layer 25 are coupled to the holes staying in the organic light-receiving layer 25. Note that, in (a), (b), and (c) of FIG. 13, illustration of the charge transport layer 26 is omitted.

In a case where the first electrode 21 is caused to function as a negative electrode and the second electrode 22 is caused to function as a positive electrode, the controller 3A may apply a voltage between the first electrode 21 and the second electrode 22 so that a potential of the first electrode 21 becomes positive with a potential of the second electrode 22 set as a reference or the potential of the second electrode 22 becomes negative with the potential of the first electrode 21 set as a reference so as to cause an electric field in a direction of causing charge separation to occur in the organic light-receiving layer 25. In addition, in a case where the first electrode 21 is caused to function as a negative electrode and the second electrode 22 is caused to function as a positive electrode, the controller 3A may apply a voltage between the first electrode 21 and the second electrode 22 so that the potential of the first electrode 21 becomes negative with the potential of the second electrode 22 set as a reference or the potential of the second electrode 22 becomes positive with the potential of the first electrode 21 set as a reference so as to cause an electric field in a direction opposite to the direction of causing charge separation to occur in the organic light-receiving layer 25.

In addition, in the light-receiving device 1A, the controller 3A detects a displacement current by applying a pulse voltage between the first electrode 21 and the second electrode 22. However, since the displacement current flows when a capacitance component exists, in the organic light-receiving element 2A including the first electrode 21 and the second electrode 22, a constant amount of displacement current flows regardless of presence or absence of accumulated charges. Here, the controller 3A acquires a differential current value or extracts a signal component of a current value by a lowpass circuit (connection of a capacitor or the like). In the case of acquiring the differential current value, the controller 3A may acquire the differential current value on the basis of "current value at the time of irradiation with light" and "current value in a state in which irradiation with light is not performed" acquired by a single organic light-receiving element 2A. Alternatively, the controller 3A may acquire the differential current value on the basis of "current value at the time of irradiation with light" acquired by an organic light-receiving element 2A for light reception and "current value in a state in which irradiation with light is not performed" acquired by an organic light-receiving element 2A for reference. The organic light-receiving element 2A for reference is an organic light-receiving element 2A in which a measure is taken to prevent light from being incident to the organic light-receiving layer 25 with a light-shielding film or a package. In the case of a plurality of the organic light-receiving element 2A for light reception are provided, at least one piece of the organic light-receiving element 2A for reference may be provided. However, in this case, the organic light-receiving element 2A for reference is disposed for every area, it is possible to suppress an influence of a deviation of "current value in a state in which irradiation with light is not performed" due to a difference in the area.

In addition, the organic light-receiving element 2A may not include the charge transport layer 26. The organic light-receiving element 2A may include a buffer layer for tunneling at a certain voltage or greater instead of the charge transport layer 26. In this case, a difference in current amount depending on presence or absence of charge accumulation can be seen.

In addition, in the organic light-receiving element 2A, a voltage may not be applied between the first electrode 21 and the second electrode 22 in at least one between the light-receiving period and the holding period. In the light-receiving period and the holding period, even when a potential difference between the first electrode 21 and the second electrode 22 is 0 V, since an internal electric field occurs in the organic light-receiving layer 25 due to a difference between a work function of the first electrode 21 and a work function of the second electrode 22, and polarization of the organic semiconductor molecules 25a, charge separation and holding of either electrons or holes generated due to charge separation become possible. However, in the light-receiving period, since it is necessary to extract the other of electron and hole generated due to charge separation from the organic light-receiving layer 25, it is necessary for the organic light-receiving element 2A to be connected to a power supply (controller 3A) regardless of whether or not a voltage is applied between the first electrode 21 and the second electrode 22. In the holding period, the organic light-receiving element 2A may be in an electrically floating state so as to maintain holding of one of electron and hole generated due to the charge separation.

In the light-receiving period, the larger a voltage applied between the first electrode 21 and the second electrode 22 so that an electric field in a direction of causing charge separation occurs in the organic light-receiving layer 25, the further one of an electron and a hole generated due to the charge separation increases. However, in the holding period, when a voltage is continuously applied between the first electrode 21 and the second electrode 22, there is a concern that one of the electron and the hole generated due to the charge separation may decrease due to an influence of a leak current or the like. Accordingly, in a case where priority is given to detection of a large amount of current, it is preferable to increase the voltage applied between the first electrode 21 and the second electrode 22, and in contrast, in a case where priority is given to securement of long holding time, it is preferable to decrease the voltage applied between the first electrode 21 and the second electrode 22.

Modification Example

The present disclosure is not limited to the first embodiment and the second embodiment described above. For example, the plurality of organic semiconductor molecules 25a contained in the organic light-receiving layer 25 may be constituted by a plurality of kinds of organic semiconductor molecules. The plurality of host molecules 25b contained in the organic light-receiving layer 25 may be constituted by a plurality of kinds of host molecules. The organic light-receiving layer 25 may not contain the plurality of host molecules 25b.

Each of the plurality of organic semiconductor molecules 25a may not satisfy the above-described various conditions as long as a molecule in which an excited state enabling the reverse intersystem crossing from the lowest excited triplet state $T_1$ to the lowest excited singlet state $S_1$ in each of the plurality of organic semiconductor molecules 25a is formed due to irradiation with light.

Figure 14:
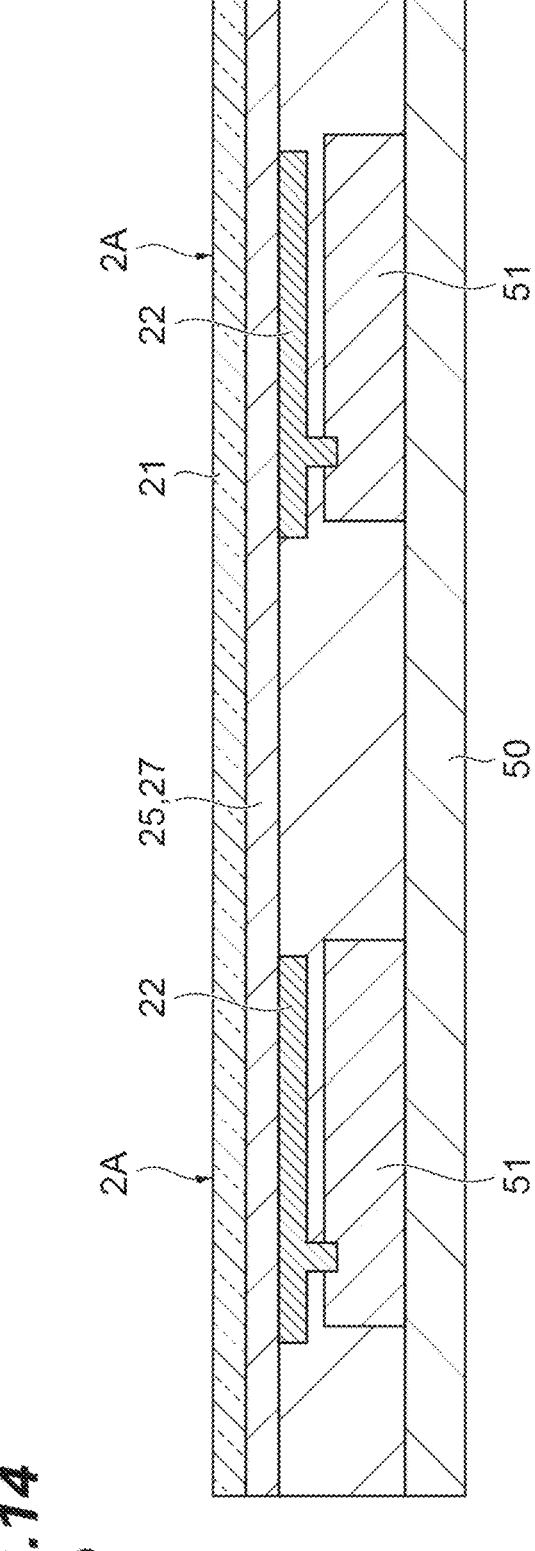
FIG. 14 is a configuration diagram of a light-receiving device of the modification example.
Figure 14:
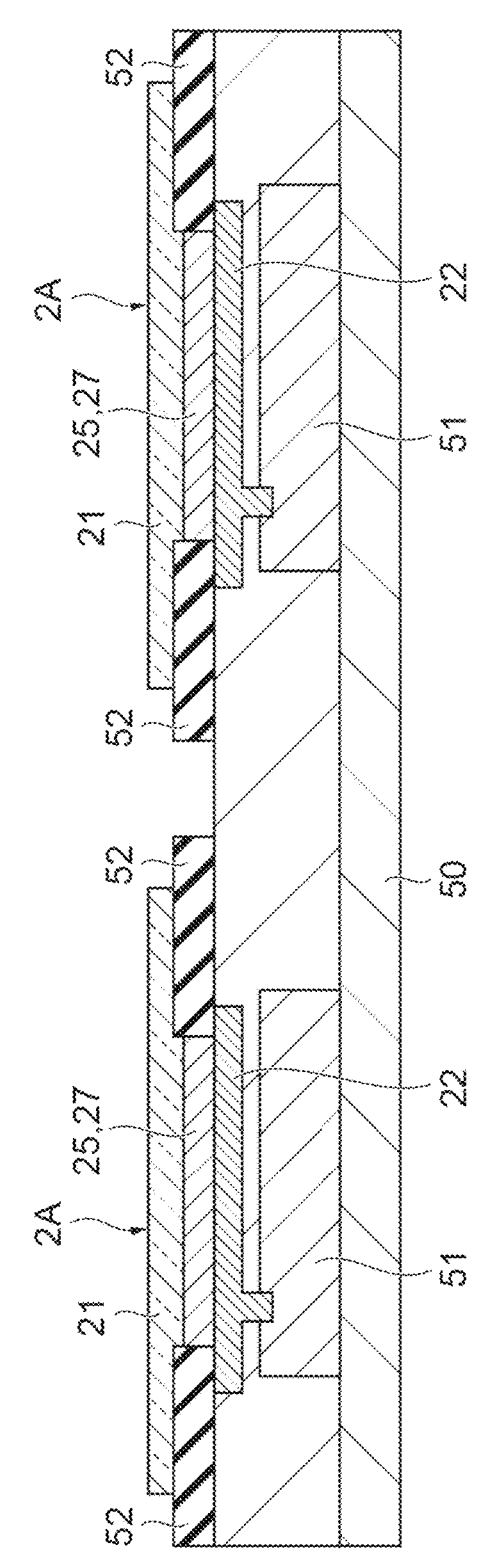

In the organic light-receiving element 2 of the first embodiment and the organic light-receiving element 2A of the second embodiment, in the light-receiving period, a voltage may be applied between the first electrode 21 and the second electrode 22 so that an electric field in a direction of causing charge separation occurs in the organic light-receiving layer 25, or a potential difference between the first electrode 21 and the second electrode 22 may be set to 0 V. That is, in the light-receiving period, each of the controllers 3 and 3A may adjust a potential difference between the first electrode 21 and the second electrode 22 so that an electric field in a direction of causing charge separation occurs in the organic light-receiving layer 25. In the organic light-receiving element 2 of the first embodiment and the organic light-receiving element 2A of the second embodiment, a plurality of the organic light-receiving layers 25 may be one-directionally or two-directionally arranged on the support substrate 20. In the organic light-receiving element 2A of the second embodiment, as described with reference to (a), (b), (c), and (d) of FIG. 11, and experiment results in FIG. 12, since electrons generated due to charge separation stay (that is, spatially held) in a constant region in the organic light-receiving layer 25, the organic light-receiving element 2A of the second embodiment is applicable to an image sensor. As an example, as illustrated in (a) and (b) of FIG. 14, the image sensor may be constituted by electrically connecting each of the plurality of organic light-receiving elements 2A to each of a plurality of read-out circuits 51 which are one-dimensionally or two-dimensionally arranged on the circuit substrate 50. In the image sensor illustrated in (a) of FIG. 14, the second electrode 22 of each of the organic light-receiving elements 2A is electrically connected to each of the read-out circuits 51, and the charge block layer 27, the organic light-receiving layer 25, and the first electrode 21 of the organic light-receiving elements 2A are continuous over the plurality of organic light-receiving elements 2A. In the image sensor illustrated in (b) of FIG. 14, the second electrode 22 of each of the organic light-receiving elements 2A is electrically connected to each of the read-out circuits 51, and the charge block layer 27, the organic light-receiving layer 25, and the first electrode 21 of the organic light-receiving elements 2A are separated for every organic light-receiving element 2A by an insulation layer 52.

REFERENCE SIGNS LIST 1, 1A: light-receiving device, 2, 2A: organic light-receiving element, 3, 3A: controller, 21: first electrode, 22: second electrode, 25: organic light-receiving layer, 25a: organic semiconductor molecule, 25b: host molecule, 26: charge transport layer, 27: charge block layer.

The invention claimed is:

1. A light-receiving device, comprising:
an organic light-receiving element; and
a controller electrically connected to the organic light-receiving element,
wherein the organic light-receiving element including:
a first electrode;
a second electrode; and
an organic light-receiving layer disposed between the first electrode and the second electrode and containing a plurality of organic semiconductor molecules,
wherein each of the plurality of organic semiconductor molecules is a molecule in which an excited state enabling reverse intersystem crossing from a lowest excited triplet state to a lowest excited singlet state is formed in each of the plurality of organic semiconductor molecules due to irradiation with light, and
the controller is configured to adjust a potential difference between the first electrode and the second electrode in a light-receiving period so that an electric field in a direction of causing charge separation occurs in the organic light-receiving layer, and detect a current generated by the charge separation.

2. The light-receiving device according to claim 1,
wherein in each of the plurality of organic semiconductor molecules, a difference between energy of the lowest excited singlet state and energy of the lowest excited triplet state at an absolute temperature of 77 K is less than 0.3 eV.

3. The light-receiving device according to claim 1,
wherein in each of the plurality of organic semiconductor molecules, an intersystem crossing rate constant from the lowest excited singlet state to the lowest excited triplet state is greater than a radiative decay rate constant from the lowest excited singlet state to the ground state.

4. The light-receiving device according to claim 1, wherein in each of the plurality of organic semiconductor molecules, the intersystem crossing rate constant from the lowest excited singlet state to the lowest excited triplet state is greater than a reverse intersystem crossing rate constant from the lowest excited triplet state to the lowest excited singlet state.

5. The light-receiving device according to claim 4, wherein in each of the plurality of organic semiconductor molecules, the intersystem crossing rate constant from the lowest excited singlet state to the lowest excited triplet state is two or more times the reverse intersystem crossing rate constant from the lowest excited triplet state to the lowest excited singlet state.

6. The light-receiving device according to claim 4, wherein in each of the plurality of organic semiconductor molecules, the reverse intersystem crossing rate constant from the lowest excited triplet state to the lowest excited singlet state is $1 \times 10^7$ ($sec^{-1}$) or less.

7. The light-receiving device according to claim 1, wherein a dipole moment of each of the plurality of organic semiconductor molecules is greater than 0 D.

8. The light-receiving device according to claim 1, wherein the light-receiving layer further contains a plurality of host molecules, and energy of the lowest excited triplet state at an absolute temperature of 77 K in each of the plurality of host molecules is higher than energy of the lowest excited triplet state at an absolute temperature of 77 K in each of the plurality of organic semiconductor molecules.

9. The light-receiving device according to claim 1, wherein at least one of the first electrode and the second electrode has a light-transmitting property with respect to light emitted to the light-receiving layer.

10. The light-receiving device according to claim 1, further comprising:
a charge block layer disposed at any one of a first position between the light-receiving layer and the first electrode, and a second position between the light-receiving layer and the second electrode.

11. The light-receiving device according to claim 10, further comprising:
a charge transport layer disposed at the other of the first position and the second position.

12. The light-receiving device according to claim 10, wherein the controller applies a voltage between the first electrode and the second electrode in an application period after passage of a holding period from the light-receiving period so that an electric field in a direction opposite to the direction of causing the charge separation occurs in the organic light-receiving layer.

* * * * *